(12) United States Patent
Fujimoto

(10) Patent No.: US 7,439,889 B2
(45) Date of Patent: Oct. 21, 2008

(54) AD CONVERTER

(75) Inventor: Yoshihisa Fujimoto, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/485,330

(22) Filed: Jul. 13, 2006

(65) Prior Publication Data

US 2007/0013571 A1    Jan. 18, 2007

(30) Foreign Application Priority Data

Jul. 14, 2005    (JP) ............................. 2005-206104

(51) Int. Cl.
*H03M 3/00*    (2006.01)

(52) U.S. Cl. .................. 341/143; 341/120; 341/122; 341/123; 341/172

(58) Field of Classification Search ................ 341/143, 341/172, 120–122
See application file for complete search history.

(56) References Cited

U.S. PATENT DOCUMENTS

| | | | | |
|---|---|---|---|---|
| 5,159,341 | A * | 10/1992 | McCartney et al. | 341/143 |
| 5,917,440 | A * | 6/1999 | Khoury | 341/143 |
| 6,111,531 | A * | 8/2000 | Farag | 341/143 |
| 6,140,950 | A * | 10/2000 | Oprescu | 341/143 |
| 6,184,811 | B1 * | 2/2001 | Nagari et al. | 341/143 |
| 6,445,331 | B1 * | 9/2002 | Stegers | 341/172 |
| 6,509,790 | B1 * | 1/2003 | Yang | 327/554 |
| 6,617,992 | B2 * | 9/2003 | Sakurai | 341/161 |
| 6,630,898 | B1 * | 10/2003 | Stegers | 341/172 |
| 6,853,241 | B2 | 2/2005 | Fujimoto | |
| 6,954,159 | B1 * | 10/2005 | Cooper et al. | 341/143 |
| 7,046,046 | B2 * | 5/2006 | Temes et al. | 327/91 |
| 7,148,832 | B2 * | 12/2006 | Wada et al. | 341/155 |
| 7,167,119 | B1 * | 1/2007 | Lei et al. | 341/143 |
| 7,196,652 | B2 * | 3/2007 | Liu et al. | 341/172 |
| 2006/0279449 | A1 * | 12/2006 | Pernici et al. | 341/172 |

FOREIGN PATENT DOCUMENTS

JP    2003-243949 A    8/2003

OTHER PUBLICATIONS

J. Silva et al., Electronics Letters, Jun. 7, 2001, vol. 37, No. 12, pp. 737-738.
J. Silva et al., IEEE International Symposium on Circuits and Systems, vol. I, May 2004, pp. 1144-1147, © 2004 IEEE.
E. Siragusa, IEE Journal of Solid-State Circuits, vol. 39, No. 12, Dec. 2004, pp. 2132 (pp. 2126-2138), © 2004 IEEE.
Y. Fujimoto et al., 2006 IEEE International Solid-State Circuits Conference, pp. 76-77, 639, © 2006 IEEE.

* cited by examiner

*Primary Examiner*—Linh V Nguyen
(74) *Attorney, Agent, or Firm*—Birch, Stewart, Kolasch & Birch, LLP

(57) ABSTRACT

The ΔΣ AD converter includes: a sampling section for sampling an input signal at each cycle Ts; an AD conversion section for performing AD conversion of the input signal; a DA conversion section for performing DA conversion of an output of the AD conversion section; and a loop filter for integrating a difference obtained by subtracting an output of the DA conversion section from an output of the sampling section so as to output the integrated difference to the AD conversion section, wherein the sampling section includes two sampling circuits disposed parallel to each other, and the two sampling circuits respectively operate at timings different from each other, and each of the sampling circuits delays the input signal so as to output the delayed input signal.

12 Claims, 14 Drawing Sheets

AD CONVERTER

This Nonprovisional application claims priority under 35 U.S.C. § 119(a) on Patent Application No. 206104/2005 filed in Japan on Jul. 14, 2005, the entire contents of which are hereby incorporated by reference.

FIELD OF THE INVENTION

The present invention relates to a delta sigma AD converter or a pipelined AD converter which samples an input signal and performs AD conversion of the sampled input signal.

BACKGROUND OF THE INVENTION

Conventionally, an analog-digital converter (hereinafter, referred to as "AD converter") using a delta sigma (hereinafter, referred to as "ΔΣ") modulator has been widely used (for example, see Non-Patent Document 1 (J. Silva, U. Moon, J. Steensgaard and G. Temes, "Wideband Low-distortion delta sigma ADC topology", Electronics Letters, 7 Jun. 2001, Vo. 37, No. 12) and Non-Patent Document 2 (J. Silva, U. Moon, and G. Temes, "Low-distortion delta sigma topologies for MASH architectures, "IEEE Int. Symp. Circuits Syst., vol. I, pp. 1144-1147, May 2004)). Such a ΔΣ AD converter provides an input signal to an AD conversion section, and performs DA conversion of an output from the AD conversion section, and integrates a difference obtained by subtracting the DA-converted signal from the input signal, and provides the integrated signal to the AD conversion section. This ΔΣ AD converter makes it easier to realize highly accurate, low distortion, and low voltage operation. Thus, the ΔΣ AD converter is applied not only to an audio but also to a radio communication receiver or the like. Further, its over sampling rate is high, so that less performance is required in an Anti-Alias filter which is necessary at a preceding stage of the ΔΣ AD converter.

FIG. 13 is a block diagram schematically illustrating a conventional ΔΣ AD converter 90. The ΔΣ AD converter 90 includes a buffer circuit 91 for supplying an input signal X to a switched-capacitor sampling section 92 and an adder 97. The sampling section 92 samples the input signal X supplied from the buffer circuit 91 and outputs the sampled signal X to a subtracter 93.

The adder 97 adds an output signal Y1 of a loop filter 96 to the input signal X supplied from the buffer circuit 91 and outputs the resultant to an AD conversion section 95. The AD conversion section 95 converts the output of the adder 97 into a signal having an N-bit digital value and outputs the converted signal as an output voltage V and provides the converted signal to a DA conversion section 94. The DA conversion section 94 converts the output of the AD conversion section 95 into a signal having an analog value and provides the signal to the subtracter 93. The subtracter 93 subtracts the output of the DA conversion section 94 from the output of the sampling section 92 and provides the resultant to the loop filter 96. The loop filter 96 outputs the output signal Y1 obtained by integrating the output of the subtracter 93 to the adder 97.

FIG. 14 is a detail block diagram illustrating a linear model in which the order of the loop filter 96 of the ΔΣ AD converter 90 is the first order. In FIG. 14, the AD converter 95 (FIG. 13) is modeled as an adder 98, and a sum of a quantization noise E(z) and the output signal supplied from the adder 97 to the AD conversion section 95 (FIG. 13) is an output signal of the AD conversion section 95 (FIG. 13). In this case, the following Expressions 1 and 2 hold.

$$V(z)=X(z)+(1-z^{-1})\cdot E(z) \quad \text{Expression 1}$$

$$Y0(z)=X(z)-V(z)=-(1-z^{-1})\cdot E(z) \quad \text{Expression 2}$$

According to the Expressions 1 and 2, the input signal X(z) is not inputted to the loop filter 96 and the loop filter 96 deals with only the shaped quantization noise E(z). Thus, any distortion of the input signal X(z) caused by the nonlinearity of the active component in the loop filter 96 does not occur. Thus, it is possible to realize a ΔΣ AD converter causing less distortion.

Further, there is widely used a pipelined AD converter arranged so that: an input signal is provided to an AD conversion section, and a signal obtained by performing DA conversion with respect to an output of the AD conversion section is subtracted from the input signal and the resultant is amplified, and the amplified signal is provided to a following pipeline stage (for example, see Non-Patent Document 3 (E. Siragusa, "A digitally Enhanced 1.8-V15-bit 40-MS/s CMOS Pipelined ADC", IEEE Journal of Solid-State Circuits, Vol. 39, No. 12, December 2004 pp. 2132)).

Further, a switched-capacitor amplifier is widely used for various purposes of use (for example, see Patent Document 1 (Japanese Unexamined Patent Application No. 243949/2003 (Tokukai 2003-243949)(Publication date: Aug. 29, 2003)), FIG. 5).

However, in the conventional ΔΣ AD converter 90, the input signal X(z) is not inputted to the loop filter 96. Thus, it is necessary to cause the subtracter 93 to offset (i) an input signal X component which passes through a signal path 81 and a signal path 82 and is converted into a signal having a digital value by the AD conversion section 95, and passes through a signal path 83 and is converted into a signal having an analog value by the DA conversion section 94 and (ii) an input signal X component which is sampled so as to be outputted by the sampling section 92. Therefore, it is necessary that the input signal X component passes through the signal path 81, the signal path 82, and the signal path 83 without delay to reach the subtracter 93. Thus, the signal path 81, the signal path 82, and the signal path 83 have to be free from any delay, so that it is necessary to so sufficiently reduce a delay quantity of the AD conversion section 95 and a delay quantity of the DA conversion section 94 that the delay quantities do not raise any problem compared with an operation frequency of the ΔΣ AD converter 90.

Further, the output of the DA conversion section 94 is a multi-valued output, so that distortion caused by unevenness of elements constituting the DA conversion section occurs. In order to reduce the distortion, mismatch shaping is often adopted. A digital circuit realizing the mismatch shaping is disposed above the signal path 83, so that it is necessary to reduce a delay quantity of the mismatch shaping digital circuit too.

In case of reducing the delay quantity of the AD conversion section 95, the delay quantity of the DA conversion section 94, and the delay quantity of the mismatch shaping digital circuit, circuit sizes and power consumption of the DA conversion section 94 and the mismatch shaping digital circuit increase. This is a problem of the conventional ΔΣ AD converter 90.

Also in the pipelined AD converter, it is necessary to so sufficiently reduce the delay quantity of the AD conversion section and the delay quantity of the DA conversion section compared with an operation frequency of the whole converter. Thus, the AD conversion section and the DA conversion section have to finish a signal process in sufficiently short time compared with the operation frequency of the whole converter (see Non-Patent Document 3, FIG. 11). As a result, it is necessary to reduce the delay quantities of the AD conversion section, the DA conversion section, and the like, so that circuit sizes and power consumption increase. This is a problem of the conventional pipelined AD converter.

SUMMARY OF THE INVENTION

An object of the present invention is to provide an AD converter which can reduce a circuit size and power consumption.

In order to achieve the foregoing object, an AD converter of the present invention includes: a sampling section for sampling an input signal at each cycle Ts; an AD conversion section for performing AD conversion of the input signal; a DA conversion section for performing DA conversion of an output of the AD conversion section; and a loop filter for integrating a difference obtained by subtracting an output of the DA conversion section from an output of the sampling section so as to output the integrated difference to the AD conversion section, wherein the sampling section includes a plurality of sampling circuits disposed parallel to each other, and the plurality of sampling circuits respectively operate at timings different from each other, and each of the sampling circuits delays the input signal so as to output the delayed input signal.

According to the arrangement, the plurality of sampling circuits are disposed on the sampling section so as to be positioned parallel to each other, and the sampling circuits disposed parallel to each other operate at timings different from each other, and each of the sampling circuits delays the input signal and outputs the delayed input signal. Thus, the plurality of sampling circuits each of which delays the input signal and outputs the delayed input signal are respectively operated so that operation timings are different from one another by a cycle Ts, thereby realizing the sampling section which performs sampling at every cycle Ts. Thus, the sampling section which performs sampling at every cycle Ts is allowed to delay, and the AD conversion section, the DA conversion section, and the like are allowed to delay in accordance with a delay quantity of the sampling section. Therefore, it is possible to decrease operation speeds of the AD conversion section, the DA conversion section, and the like while keeping the cycle Ts constant. As a result, it is possible to reduce circuit sizes and power consumption of the AD conversion section, the DA conversion section, and the like, which are provided in the AD converter.

In order to achieve the foregoing object, another AD converter of the present invention includes: a sampling section for sampling an input signal at each cycle Ts; a first AD conversion section for performing AD conversion of the input signal; a first DA conversion section for performing DA conversion of an output of the first AD conversion section; a first loop filter for integrating a difference obtained by subtracting an output of the first DA conversion section from an output of the sampling section so as to output the integrated difference to the first AD conversion section; a second AD conversion section for performing AD conversion of an output of the first loop filter; a second DA conversion section for performing DA conversion of an output of the second AD conversion section; and a second loop filter for integrating a difference obtained by subtracting an output of the second DA conversion section from an output of the first loop filter so as to output the integrated difference to the second AD conversion section, wherein the sampling section includes a plurality of sampling circuits disposed parallel to each other, and the plurality of sampling circuits respectively operate at timings different from each other, and each of the sampling circuits delays the input signal so as to output the delayed input signal.

According to the arrangement, the plurality of sampling circuits are disposed on the sampling section so as to be positioned parallel to each other, and the sampling circuits disposed parallel to each other respectively operate at timings different from each other, and each of the sampling circuits delays the input signal and outputs the delayed input signal. Thus, the plurality of sampling circuits each of which delays the input signal and outputs the delayed input signal are respectively operated so that operation timings are different from one another by a cycle Ts, thereby realizing the sampling section which performs sampling at every cycle Ts. Thus, the sampling section which performs sampling at every cycle Ts is allowed to delay, and the AD conversion section, the DA conversion section, and the like are allowed to delay in accordance with a delay quantity of the sampling section. Therefore, it is possible to decrease operation speeds of the AD conversion section, the DA conversion section, and the like. As a result, it is possible to reduce circuit sizes and power consumption of the AD conversion section, the DA conversion section, and the like, which are provided in the AD converter, while keeping the cycle Ts constant.

In order to achieve the foregoing object, still another AD converter of the present invention includes: a sampling section for sampling an input signal at each cycle Ts; a first AD conversion section for performing AD conversion of the input signal; a DA conversion section for performing DA conversion of an output of the first AD conversion section; an amplifier for amplifying a difference obtained by subtracting an output of the DA conversion section from an output of the sampling section; a second AD conversion section for performing AD conversion of an output of the amplifier; a digital amplifier for amplifying an output of the second AD conversion section; and an adder for adding an output of the digital amplifier to the output of the first AD conversion section so as to output a result of addition, wherein the sampling section includes a plurality of sampling circuits disposed parallel to each other, and the plurality of sampling circuits respectively operate at timings different from each other, and each of the sampling circuits delays the input signal so as to output the delayed input signal.

According to the arrangement, the plurality of sampling circuits are disposed on the sampling section so as to be positioned parallel to each other, and the sampling circuits disposed parallel to each other respectively operate at timings different from each other, and each of the sampling circuits delays the input signal and outputs the delayed input signal. Thus, the plurality of sampling circuits each of which delays the input signal and outputs the delayed input signal are respectively operated so that operation timings are different from one another by a cycle Ts, thereby realizing the sampling section which performs sampling at every cycle Ts. Thus, the sampling section which performs sampling at every cycle Ts is allowed to delay, and the AD conversion section, the DA conversion section, and the like are allowed to delay in accordance with a delay quantity of the sampling section. Therefore, it is possible to decrease operation speeds of the AD conversion section, the DA conversion section, and the like. As a result, it is possible to reduce circuit sizes and power consumption of the AD conversion section, the DA conversion section, and the like, which are provided in the AD converter.

Additional objects, features, and strengths of the present invention will be made clear by the description below. Further, the advantages of the present invention will be evident from the following explanation in reference to the drawings.

DESCRIPTION OF THE EMBODIMENTS

One embodiment of the present invention is described as follows with reference to FIG. 1 to FIG. 10.

Embodiment 1

Figure 1:
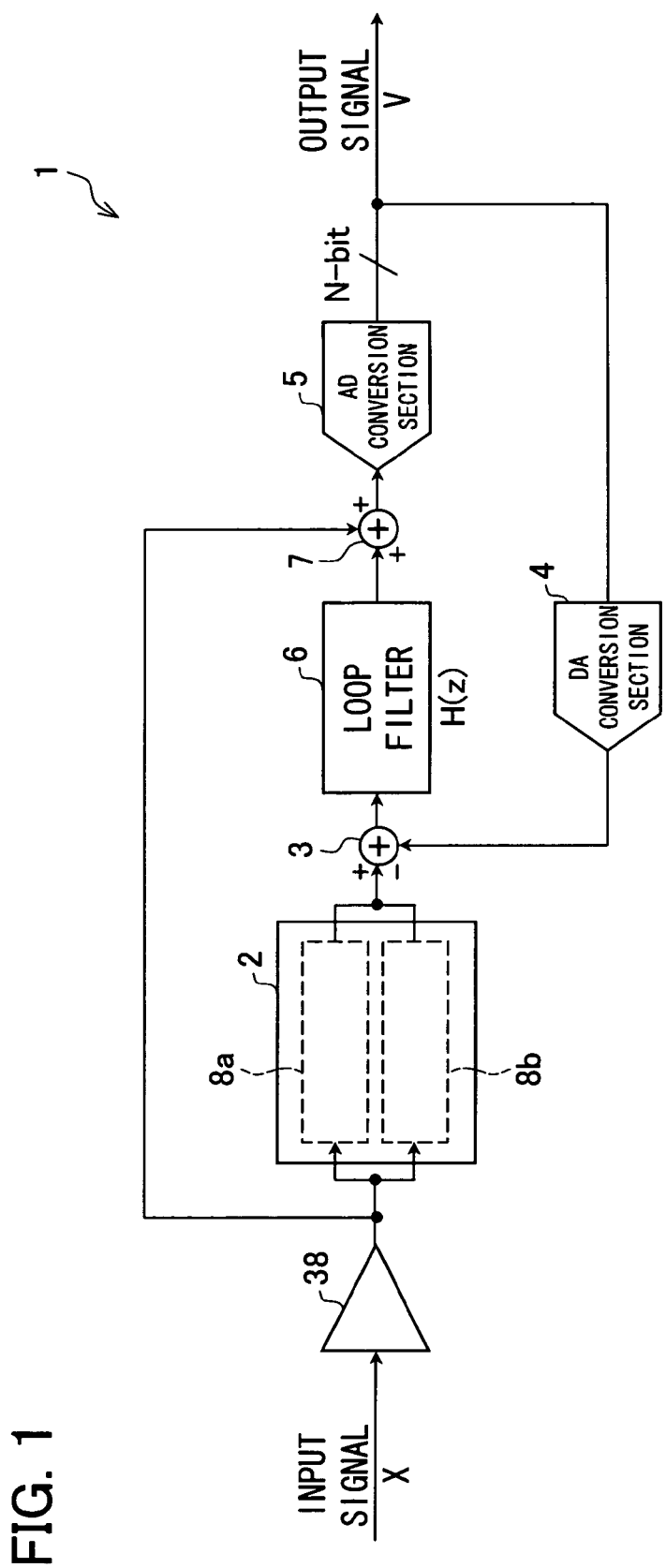
FIG. 1 is a block diagram schematically illustrating one embodiment of an AD converter of the present invention.

The following explains one embodiment of the present invention with reference to FIG. 1 to FIG. 8. FIG. 1 is a block diagram schematically illustrating one embodiment of an AD converter of the present invention.

A $\Delta\Sigma$ AD converter 1 of the present embodiment includes a buffer circuit 38 for supplying an input signal X to a sampling section 2 and an adder 7.

The sampling section 2 is provided to perform double sampling with respect to the input signal X and has two sampling circuits 8a and 8b disposed parallel to each other. The sampling circuits 8a and 8b respectively operate at respective timings, and each of the sampling circuits 8a and 8b delays the input signal X and outputs the delayed signal to a subtracter 3.

The adder 7 adds an output signal of the loop filter 6 to the input signal X supplied from the buffer circuit 38 and outputs the resultant to an AD conversion section 5. The AD conversion section 5 converts the output signal of the adder 7 into a signal having an N-bit digital value so as to output the converted signal as an output signal V and provide the output signal V to a DA converter 4. The DA converter 4 converts an output of the AD converter 5 into a signal having an analog value and provides the converted signal to the subtracter 3. The subtracter 3 subtracts an output of the DA converter 4 from the output of the sampling section 2 and provides the resultant to the loop filter 6. The loop filter 6 outputs an output signal obtained by integrating the output of the subtracter 3 to the adder 7.

Figure 2:
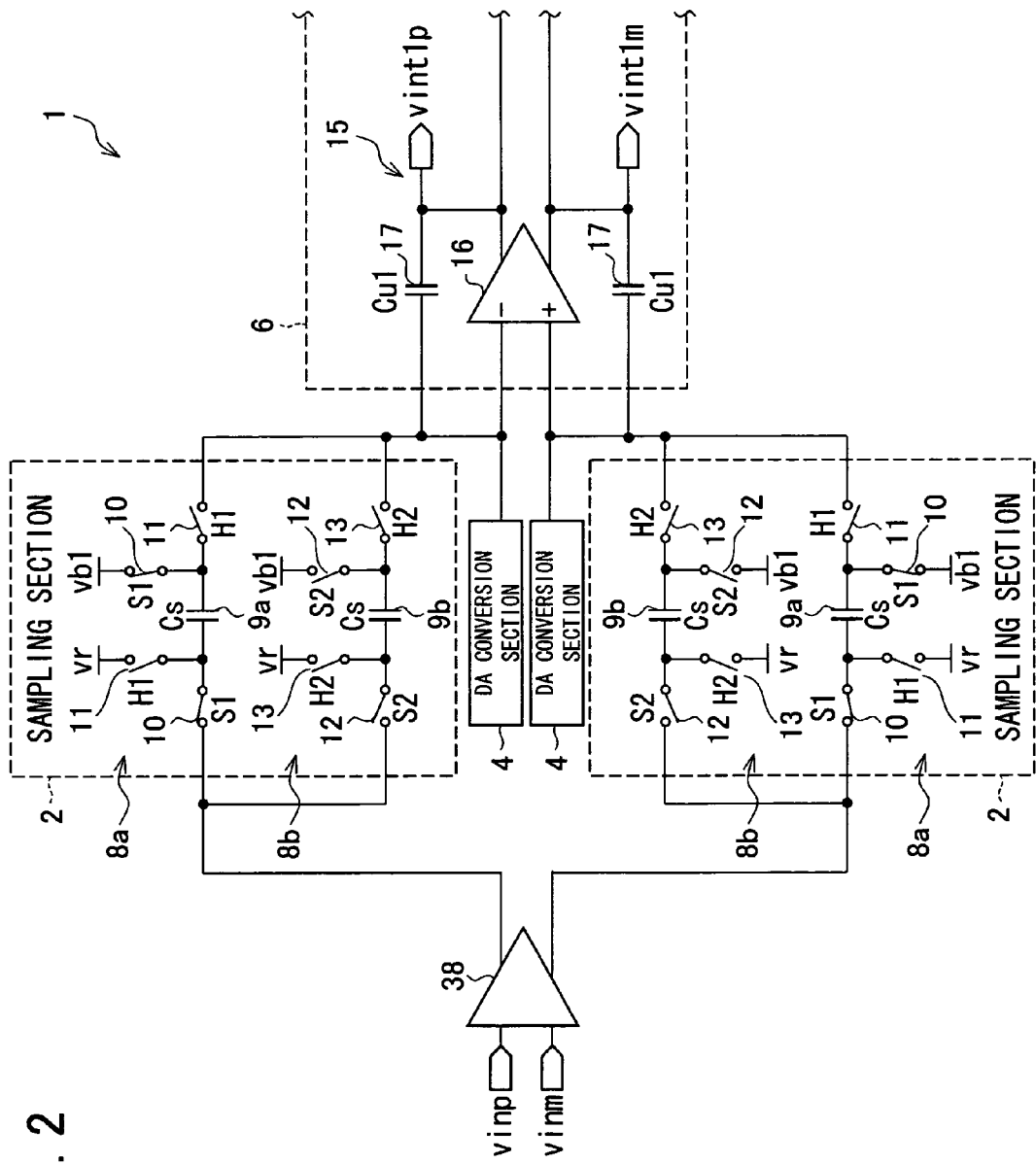
FIG. 2 is a circuit diagram illustrating a structure of a sampling section of the AD converter.

FIG. 2 is a circuit diagram illustrating a structure of the sampling section 2. The same reference numerals of the components described with reference to the aforementioned drawings are given to the corresponding components, and detail descriptions thereof are omitted. The following drawings are illustrated in the same manner.

The input signal X is actually provided as differential input signals vinp and vinm. An actual circuit includes (i) two sampling sections 2 respectively corresponding to the differential input signals vinp and vinm and (ii) two DA conversion sections 4 corresponding to the differential input signals vinp and vinm so that the sampling sections 2 and the DA conversion sections 4 are disposed in a vertically symmetric manner in FIG. 2. The loop filter 6 includes an integrator 15. The integrator 15 includes an. operational amplifier 16. One of the sampling sections 2 and one of the DA conversion sections 4 are connected to an inversion input terminal of the operational amplifier 16. The other of the sampling sections 2 and the other of the DA conversion sections 4 are connected to an noninversion input terminal of the operational amplifier 16. The integrator 15 includes two capacitors 17. One end of one capacitor 17 is connected to the inversion input terminal of the operational amplifier 16. The other end of the capacitor 17 is connected to the noninversion output terminal of the operational amplifier 16. One end of the other capacitor 17 is connected to the noninversion input terminal of the operational amplifier 16. The other end of the capacitor 17 is connected to the inversion output terminal of the operational amplifier 16.

Figure 3:
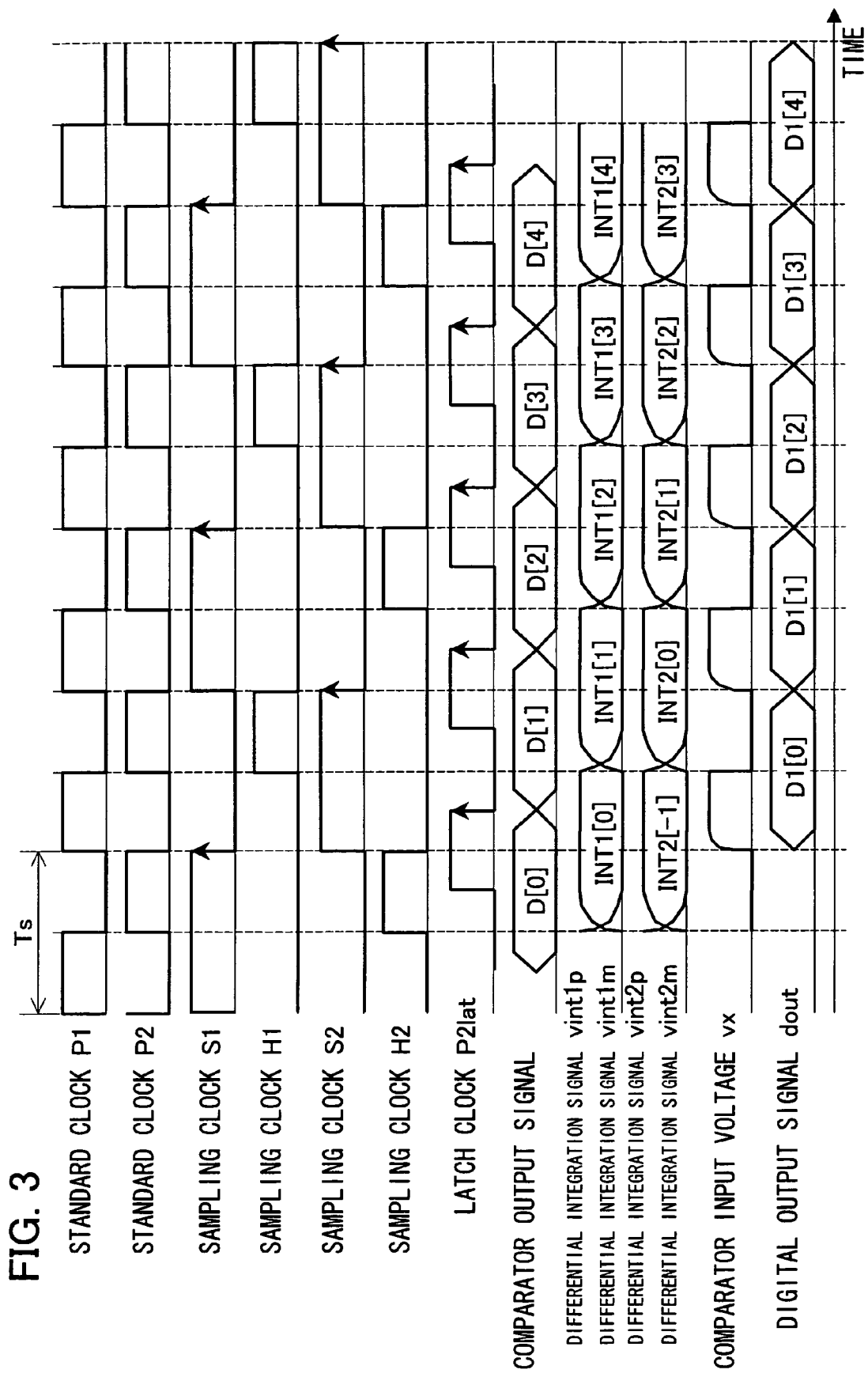
FIG. 3 is a timing chart illustrating how the AD converter operates.

FIG. 3 is a timing chart for illustrating how the $\Delta\Sigma$ AD converter 1 operates. According to FIG. 2 and FIG. 3, a sampling circuit 8a of the sampling section 2 to which the differential input signal vinp is supplied from the buffer circuit 38 includes a capacitor 9a having a capacitance Cs. There are generated standard clocks P1 and P2 each of which has a square wave and serves as a standard of operation of the $\Delta\Sigma$ AD converter 1, and there are generated sampling clocks S1, H1, S2, and H2 which are required in the sampling circuits 8a and 8b for performing double sampling in accordance with the standard clocks P1 and P2.

Switches 10 which become ON while the sampling clock S1 is high and become OFF while the sampling clock S1 is low are provided on each of the upstream side and the downstream side of the capacitor 9a. The switch 10 on the upstream side becomes ON while the sampling clock S1 is high, and leads the differential input signal vinp to the capacitor 9a so as to store the signal as electric charge. The switch 10 on the downstream side becomes ON while the sampling clock S1 is high, and connects the capacitor 9a to a terminal whose reference potential is vb1.

Further, Switches 11 which become ON while the sampling clock H1 is high and become OFF while the sampling clock H1 is low are provided on each of the upstream side and the downstream side of the capacitor 9a. The switch 11 on the upstream side becomes ON while the sampling clock H1 is high, and connects the capacitor 9a to a terminal whose reference potential is vr. The switch 11 on the downstream side becomes ON while the sampling clock H1 is high, and releases the electric charge stored in the capacitor 9a to the loop filter 6.

As in the sampling circuit 8a, also the sampling circuit 8b includes a capacitor 9b having a capacitance Cs. Switches 12 which become ON while the sampling clock S2 is high and become OFF while the sampling clock S2 is low are provided on each of the upstream side and the downstream side of the capacitor 9b. Further, switches 13 which become ON while the sampling clock H2 is high and become OFF while the sampling clock H2 is low are provided on each of the upstream side and the downstream side of the capacitor 9b.

Each of the capacitors 9a and 9b samples an input signal (the differential input signal vinp or the differential input signal vinm) at a timing indicated by a falling edge (an arrow in FIG. 3) of each of the sampling clocks S1 and S2 where falling edge occurs at every Ts×2 cycle. The electric charge sampled in the capacitor 9a and the electric charge sampled in the capacitor 9b are alternately sent to the integrator 15 constituting the loop filter 6. A timing at which the electric charge is sent from the capacitor 9a to the integrator 15 and a timing at which the electric charge is sent from the capacitor 9b to the integrator 15 delay from a timing at which the input signal is sampled with the delay corresponding to ½ Ts. Thus, the input signal X is inputted to the loop filter 6 with the input signal X delaying by ½ Ts.

Figure 4:
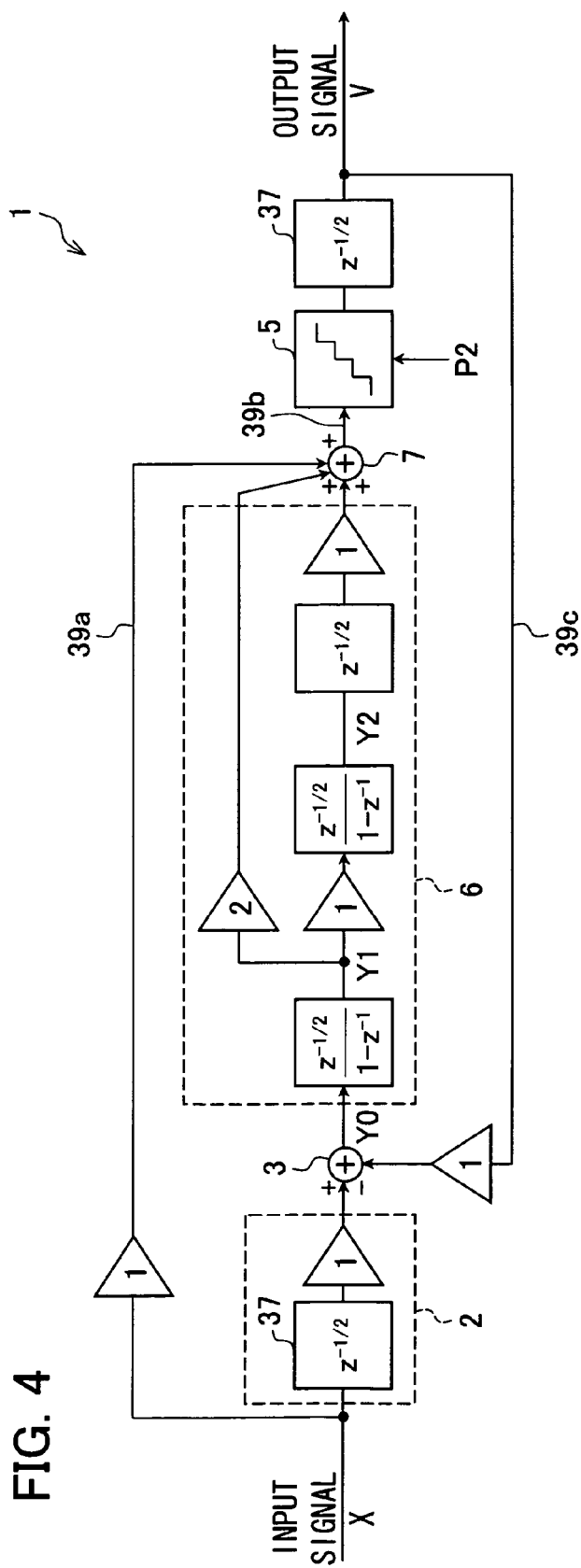
FIG. 4 is a detail block diagram illustrating a linear model of the AD converter.

FIG. 4 is a detail block diagram illustrating a linear model of the ΔΣ AD converter 1. It is assumed that the DA conversion section 4 shows ideal property, so that illustration thereof is omitted. Further, a first order loop filter is exemplified in FIG. 15 so as to simplify the illustration, but a second order loop filter is used as the loop filter 6 of Embodiment 1.

The input signal X is delayed by (½)Ts at a delay stage 37 of the sampling section 2 which performs double sampling and is inputted to the subtracter 3 after passing through a gain stage whose gain is 1. Further, the input signal X is inputted to the AD conversion section 5 after passing through the gain stage whose gain is 1 and the adder 7. An output of the AD conversion section 5 is delayed by (½)Ts at the delay stage 37 and is fedback to the subtracter 3 after passing through the gain stage whose gain is 1. In this way, a delay quantity of each of the signal paths 39a, 39b, and 39c passing through the AD conversion section 5 and the DA conversion section 4 (FIG. 1) is (½)Ts of a delay quantity caused at the delay stage 37 provided on the output side of the AD conversion section 5, and is equal to (½)Ts of a delay quantity between input and output of the delay stage 37 in the sampling section 2.

The loop filter 6 includes: two discrete-time integrators each of which causes a delay quantity of (½)Ts; a delay stage which causes a delay quantity of (½)Ts; and a plurality of gain stages.

In this way, the delay stage 37 for delaying the input signal is provided on the sampling section 2, so that it is possible to additionally provide a delay stage 37 on the output side of the AD conversion section 5. A delay quantity of the additional delay stage 37 can be assigned to a delay quantity of the AD conversion section 5, a delay quantity of the DA conversion section 4, and a delay quantity of the mismatch shaping digital circuit. That is, the delay quantity of the AD conversion section 5, the delay quantity of the DA conversion section 4, and the delay quantity of the mismatch shaping digital circuit are increased, thereby reducing operation speeds respectively required therein. Thus, it is possible to reduce circuit sizes and power consumption of the AD conversion section 5, the DA conversion section 4, and the mismatch shaping digital circuit.

When the AD conversion section 5 illustrated in FIG. 4 is modeled by the adder as described above with reference to FIG. 14 and it is assumed that a quantization noise included in the AD conversion section 5 is E(z), the following Expression 3 holds concerning the input signal X, the output signal V, and the quantization noise E.

$$\left( (X(z) \cdot z^{-1/2} - V) \frac{z^{-1/2}}{1-z^{-1}} \cdot \left(2 + \frac{z^{-1}}{1-z^{-1}}\right) + X(z) + E(z) \right) \cdot$$
$$z^{-1/2} = V(z)$$
Expression 3

The Expression 3 is modified into the following Expression 4.

$V(z)=z^{-1/2} \cdot X(z)+z^{-1/2} \cdot (1-z^{-1})^2 \cdot E(z)=STF(z) \cdot X(z)+NTF(z) \cdot E(z)$  Expression 4

The Expression 4 shows that the input signal X is outputted with it delayed by (½)Ts and the quantization noise E is outputted after being shaped with the second order integration filter. Further, an input signal Y0 to the loop filter 6 is represented by the following Expression 5.

$Y0(z)=z^{-1/2} \cdot X(z)-V(z)=-z^{-1/2} \cdot (1-z^{-1})^2 \cdot E(z)$  Expression 5

The Expression 5 shows that: even when the delay stage 37 for causing a delay quantity of (½)Ts is added to the output side of the AD conversion section 5 in the loop as illustrated in FIG. 4, the input signal X is not inputted to the loop filter 6 and only the filtered quantization noise E is inputted to the loop filter 6 as in the conventional structure described above with reference to FIG. 14. Thus, no distortion of the input signal X is caused by the nonlinearity of active components in the loop filter 6.

Figure 5:
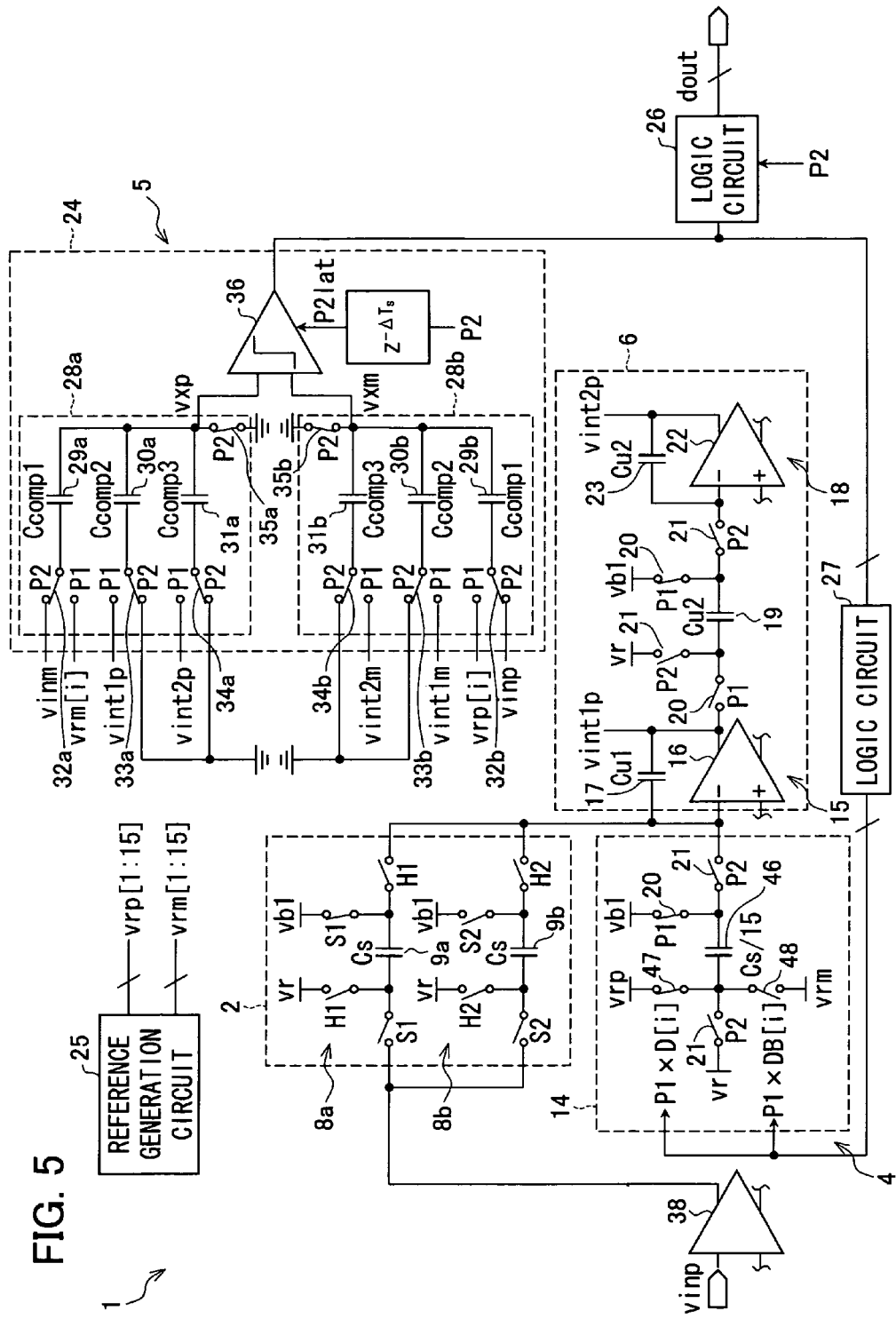
FIG. 5 is a circuit diagram specifically illustrating the structure of the AD converter.

FIG. 5 is a circuit diagram specifically illustrating a structure of the ΔΣ AD converter 1. For example, FIG. 5 illustrates: the sampling section 2 to which the differential input signal vinp is supplied so that the sampling section 2 is connected to the inversion input terminal of the operational amplifier 16; and the DA conversion section 4 which is connected to the inversion input terminal of the operational amplifier 16. However, actually, there are provided: the sampling section 2 to which the differential input signal vinm is supplied so that the sampling section 2 is connected to the noninversion input terminal of the operational amplifier 16; and the DA converter 4 which is connected to the noninversion input terminal of the operational amplifier 16 as illustrated in FIG. 2. Further, a common feedback circuit and the like are omitted.

The loop filter 6 includes an integrator 18 for integrating a differential integration signal vint1p and a differential integration signal vint1m of the integrator 15. The integrator 18 includes an operational amplifier 22. The capacitor 19 having a capacitance Cu2 is provided between the noninversion output terminal of the operational amplifier 16 and the inversion input terminal of the operational amplifier 22.

Switches 20 which become ON while the standard clock P1 is high and become OFF while the standard clock P1 is low are provided on each of the upstream side and the downstream side of the capacitor 19. The switch 20 on the upstream side becomes ON while the standard clock P1 is high, and leads the differential integration signal vint1p of the integrator 15 to the capacitor 19 so that the signal is stored as electric charge. The switch 20 on the downstream side becomes ON while the standard clock P1 is high, and connects the capacitor 19 to a terminal whose reference potential is vb1.

Further, switches 21 which become ON while the standard clock P2 is high and become OFF while the standard clock P2 is low are provided on each of the upstream side and the downstream side of the capacitor 19. The switch 21 on the upstream side becomes ON while the standard clock P2 is high, and connects the capacitor 19 to a terminal whose reference potential is vr. The switch 21 on the downstream side becomes ON while the standard clock P2 is high, and releases the electric charge stored in the capacitor 19 to a capacitor 23 which is connected to the inversion input terminal and the noninversion output terminal of the operational amplifier 22 and has a capacitance Cu2. The capacitor 19 having a capacitance Cu2 (not illustrated) is provided between the inversion output terminal of the operational amplifier 16 and the noninversion input terminal of the operational amplifier 22.

The ΔΣ AD converter 1 includes a reference generation circuit 25 for generating differential reference levels vrp [1:15] and vrm [1:15] each of which is a comparative potential supplied to fifteen 1-bit AD conversion circuits 25 described later.

The AD conversion section 5 includes fifteen 1-bit AD conversion circuits 24. Each 1-bit AD conversion circuit 24 adds (i) the differential input signals vinm and vinp of the input signal X, (ii) the differential integration signals vint1$p$ and vint1$m$, and (iii) the differential integration signals vint2$p$ and vint2$m$ of the integrator 18 to one another, and performs AD conversion. The present embodiment illustrates an example where resolution of the AD conversion section 5 is 4 bits (16 levels), but the present invention is not limited to this. The resolution of the AD conversion section 5 may have another value.

Each 1-bit AD conversion circuit 24 includes two adders 28$a$ and 28$b$ and a comparator 36. The adder 28$a$ includes a capacitor 29$a$ having a capacitance Ccomp1, a capacitor 30$a$ having a capacitance Ccomp2, and a capacitor 31$a$ having a capacitance Ccomp3. On the upstream side of the capacitor 29$a$, there is provided a switch 32$a$ which is connected to a terminal on the side of the reference level vrm [i] while the standard clock P1 is high and is connected to a terminal on the side of the differential input signal vinm while the standard clock P2 is high. On the upstream side of the capacitor 30$a$, there is provided a switch 33$a$ which is connected to a terminal on the side of the differential integration signal vint1$p$ while the standard clock P1 is high and is connected to a terminal on the ground side while the standard clock P2 is high. On the upstream side of the capacitor 31$a$, there is provided a switch 34$a$ which is connected to a terminal on the side of the differential integration signal vint2$p$ while the standard clock P1 is high and is connected to a terminal on the ground side while the standard clock P2 is high. One of input terminals of the comparator 36 is connected to the downstream sides of the capacitors 29$a$, 30$a$, and 31$a$. Also a switch 35$a$ which is grounded while the standard clock P2 is high and becomes OFF while the standard clock P2 is low is connected to the downstream sides of the capacitors 29$a$, 30$a$, and 31$a$.

Also the adder 28$b$ is arranged in a manner similar to the arrangement of the adder 28$a$, and includes a capacitor 29$b$ having a capacitance Ccomp1, a capacitor 30$b$ having a capacitance Ccomp2, and a capacitor 31$b$ having a capacitance Ccomp3. On the upstream side of the capacitor 29$b$, there is provided a switch 32$b$ which is connected to a terminal on the side of the differential reference level vrp[i] while the standard clock P1 is high and is connected to a terminal on the side of the differential reference level vinp while the standard clock P2 is high. On the upstream side of the capacitor 30$b$, there is provided a switch 33$b$ which is connected to a terminal on the side of the differential integration signal vint1$m$ while the standard clock P1 is high and is connected to a terminal on the ground side while the standard clock P2 is high. On the upstream side of the capacitor 31$b$, there is provided a switch 34$b$ which is connected to a terminal on the side of the differential integration signal vint2$m$ while the standard clock P1 is high and is connected to a terminal on the ground side while the standard clock P2 is high. The other terminal of the input terminals of the comparator 36 is connected to the downstream sides of the capacitors 29$b$, 30$b$, and 31$b$. Also a switch 35$b$ which becomes ON while the standard clock P2 is high so as to be grounded and becomes OFF while the standard clock P2 is low is connected to the downstream sides of the capacitors 29$b$, 30$b$, and 31$b$.

The adder 28$a$ adds the differential input signal vinm, the differential reference level vrm[i], the differential integration signal vint1$p$, and the differential integration signal vinm to one another with them weighted by the capacitors 29$a$, 30$a$, and 31$a$, and supplies the resultant to the comparator 36 as a differential input voltage vxp. The adder 28$b$ adds the differential input signal vinp, the differential reference level vrp[i], the differential integration signal vint1$m$, and the differential integration signal vint2$m$ to one another with them weighted by the capacitors 29$b$, 30$b$, and 31$b$, and supplies the resultant to the comparator 36 as a differential input voltage vxm.

Here, a comparator input voltage vx=vxp−vxm (FIG. 3) which is inputted to the comparator 36 while the standard clock P1 is high is obtained by the following Expression 6.

$$v_X = \frac{C_{COMP1} \cdot (v_{IN} - v_R[i]) + C_{COMP2} \cdot v_{INT1} + C_{COMP3} \cdot v_{INT2}}{C_{COMP1} + C_{COMP2} + C_{COMP3}}$$

Expression 6 where the input signal $v_{IN}$=vinp−vinm, the reference level $v_R[i]$=vrp[i]−vrm[i], the integration signal $v_{INT1}$=vint1$p$−vint1$m$, and the integration signal $v_{INT2}$=vint2$p$−vint2$m$.

According to the Expression 6, by setting capacitances of the three capacitors so that Ccomp1:Ccomp2:Ccomp3=1:2:1, it is possible to realize the same function as that of the adder 7 illustrated in FIG. 4. Note that, the Expression 6 further includes decrement of ¼ caused by switched capacitors (capacitors having capacitances Ccomp1 to Ccomp3) provided on each of fifteen 1-bit AD conversion circuits 24 constituting the AD conversion section 5.

Each of fifteen comparators 36 outputs a comparator output signal (FIG. 3), having a digital value of "0" or "1" as a result of comparison of the differential input voltages vxp and vxm, at a falling edge of a latch clock P2lat obtained by delaying the standard clock P2 by ΔTs.

The ΔΣ AD converter 1 includes a logic circuit (LOGIC bubble correction decoder) 26 and a logic circuit (Data Weighted Averaging Block) 27. The logic circuit 26 outputs a digital output signal dout, obtained by converting a 15-bit thermometer code generated by the fifteen 1-bit AD conversion circuit 24, into a binary code. The logic circuit 27 performs data weighted averaging with respect to the 15-bit thermometer code and provides 15-bit digital data D[1:15] and 15-bit digital data DB[1:15] to the DA conversion section 4.

The DA conversion section 4 includes fifteen 1-bit DA conversion circuits 14. Each of the 1-bit DA conversion circuits 14 includes a capacitor 46 having a capacitance Cs/15. Switches 47 and 48 and a switch 21 are connected to the upstream side of the capacitor 46. The switch 47 becomes ON while AND of the standard clock P1 and the digital data D[i] is "truth" and connects a terminal of the differential reference level vrp (=Vrp[15]) to the capacitor 46 so that electric charge is stored. The switch 48 becomes ON while AND of the standard clock P1 and the digital data DB[i] is "truth" and connects a terminal of the differential reference level vrm (=Vrm[15]) to the capacitor 46 so that electric charge is stored. The switch 21 becomes ON while the standard clock P2 is high and connects a terminal of the reference potential vr to the capacitor 46. The switches 20 and 21 are connected to the downstream side of the capacitor 46. The switch 20 on the downstream side becomes ON while the standard clock P1 is high and connects the capacitor 46 to a terminal of the reference potential vb1. The switch 21 becomes ON while the standard clock P2 is high and releases the electric charge stored in the capacitor 46 to the loop filter 6.

According to FIG. 3, the AD conversion section 5 converts a sum of the differential input signals vinm and vinp and the differential integration signals vint1p, vint2p, vint1m, and vint2m, which are outputted from the respective integrators, into a digital value in a period from falling of the standard clock P2 to subsequent falling of the latch clock P2lat, and the logic circuit 27 finishes the data weighted averaging after falling of the latch clock P2lat by the time when the standard clock P2 rises. The DA conversion section 4 performs DA conversion since the rising of the standard clock P2.

Figure 6:
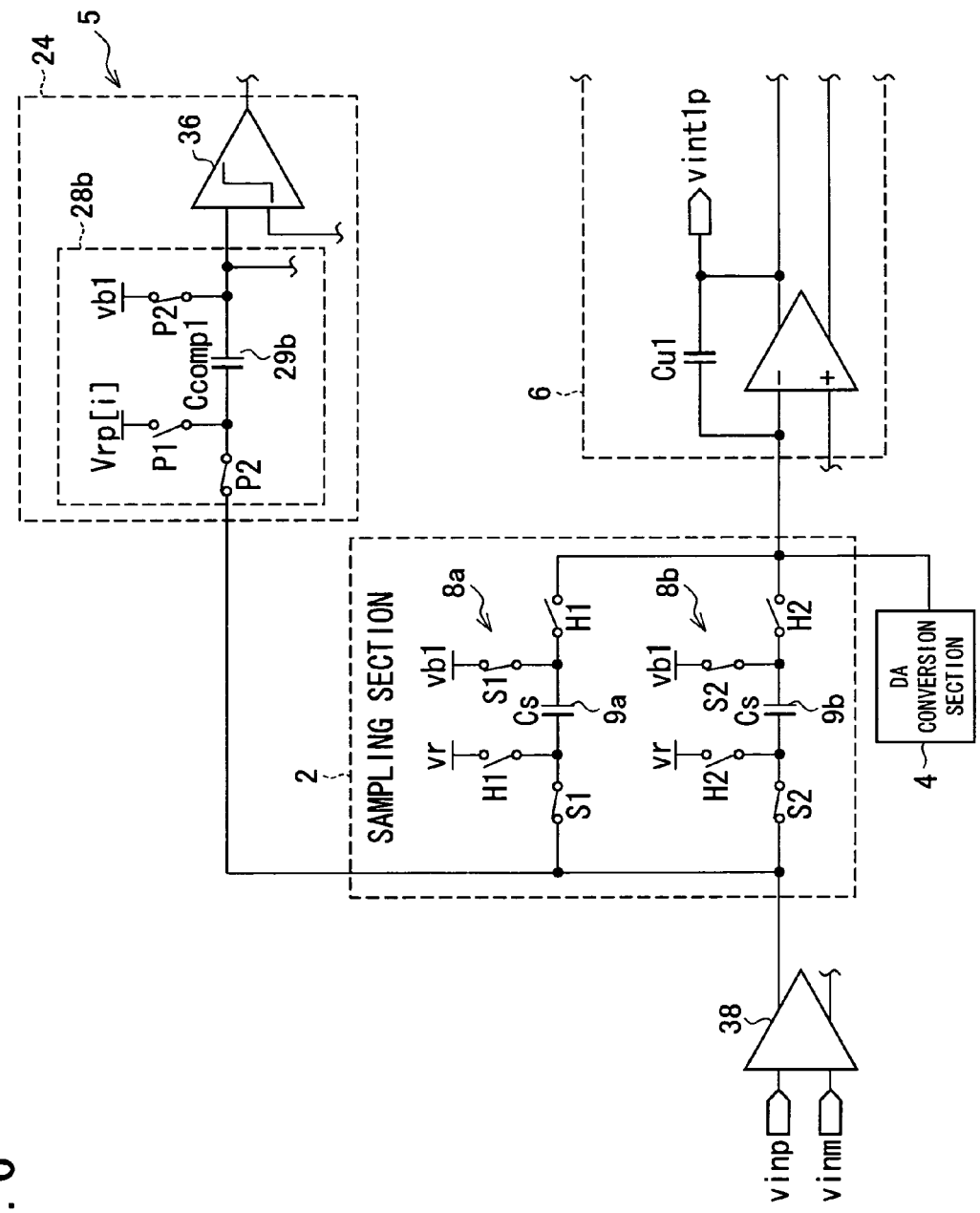
FIG. 6 is a circuit diagram illustrating how a buffer circuit provided in the AD converter operates.

FIG. 6 is a circuit diagram illustrating how the buffer circuit 38 provided in the ΔΣ AD converter 1 operates. In case where the capacitance Cs of the capacitors 9a and 9b of the sampling section 2 is much higher than a value 15 times as high as the capacitance Ccomp1 of the capacitor 29b of the 1-bit AD conversion circuit 24, that is, $$Cs \gg 15 \times Ccomp1,$$

a load of the buffer circuit 38 is substantially determined by the capacitance Cs of the capacitors 9a and 9b of the sampling section 2. At this time, a settling time of the sampling section 2 is a period in which a sampling clock S1 or a sampling clock S2 becomes high, and a length of the period corresponds to a cycle Ts.

In the conventional structure (FIG. 14), the sampling section 92 is constituted of a single sampling circuit, and the sampling clocks S1 and S2 are respectively equal to the standard clocks P1 and P2. Thus, a length of a period in which the sampling clock S1 or the sampling clock S2 becomes high corresponds to a cycle Ts×(½). That is, the settling time for the sampling section 92 is the cycle Ts×(½).

Figure 14:
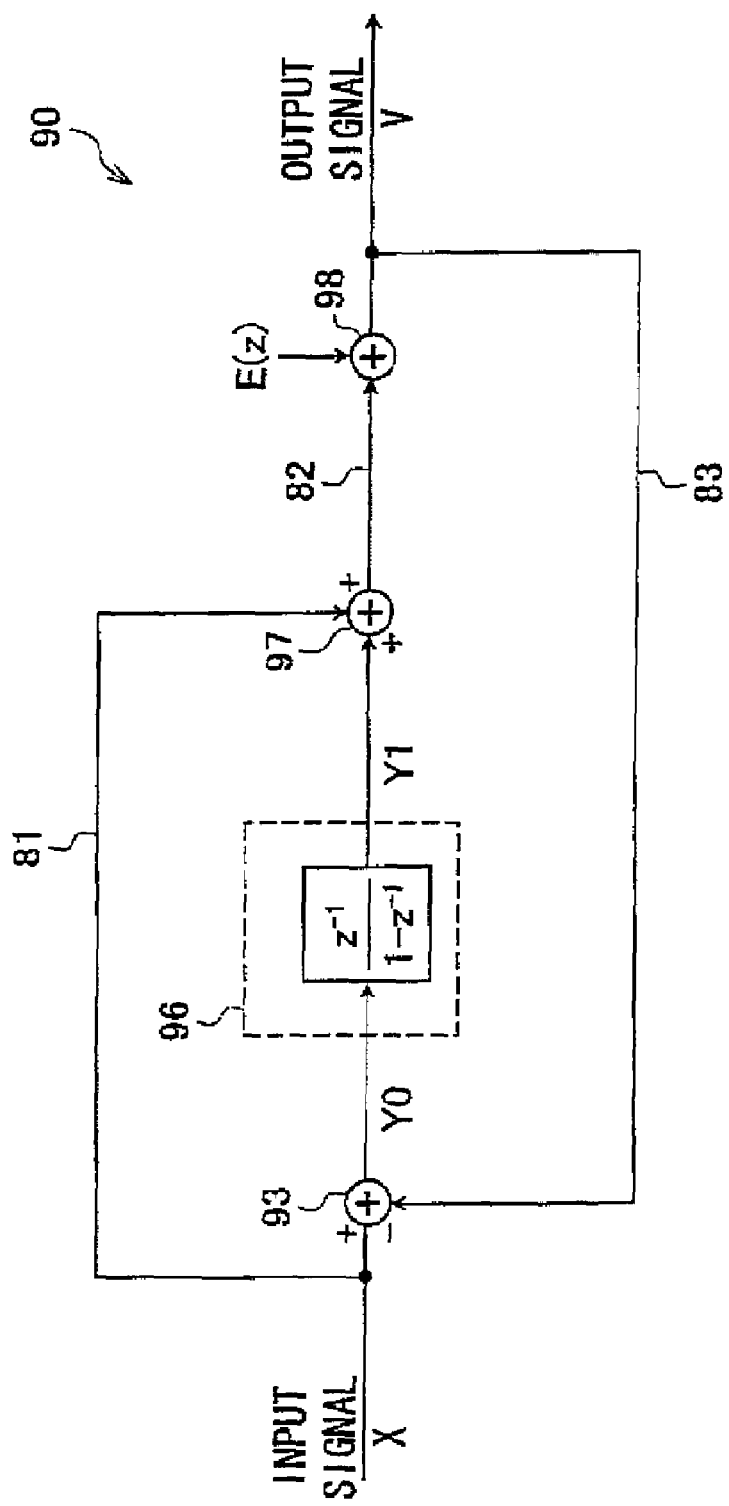
FIG. 14 is a detail block diagram illustrating a linear model of the $\Delta\Sigma$ AD converter.

Thus, according to the present embodiment, the settling time can be set to Ts twice as high as (½)Ts of the conventional structure (FIG. 14). Thus, it is possible to reduce the driving ability of the buffer circuit 38, thereby reducing the power consumption.

While, in case where the capacitance Cs of the capacitors 9a and 9b is represented as follows $$Cs \approx 15 \times Ccomp1,$$

that is, in case where a sampling capacitance of the sampling section 2 is equal to a sum of sampling capacitances of fifteen 1-bit AD conversion circuits 24 of the capacitor 29b, the capacitance Ccomp1 of the capacitor 29b greatly contributes to the load of the buffer circuit 38. Thus, it is difficult to reduce the driving ability of the buffer circuit 38 according to the structure illustrated in FIG. 6.

In this case, when the sampling circuit of the capacitor 29b of each of the fifteen 1-bit AD conversion circuits 24 is a double sampling type as in the sampling circuits 8a and 8b, it is possible to reduce the driving ability and the power consumption of the buffer circuit 38.

The sampling circuits 8a and 8b perform the double sampling, so that a sampling interval is Ts. However, if the sampling circuit of the capacitor 29b of the 1-bit AD conversion circuit 24 does not perform the double sampling, the sampling interval is Ts/2, so that it is necessary to sample the differential input signal vinp within a period (Ts/2) in which the standard clock P2 is high. Thus, the buffer circuit 38 has to cause the capacitor 29b to be charged with the differential input signal within the sampling interval. As the sampling interval becomes shorter, the settling time becomes shorter, so that a current which has to be flown to the buffer circuit 38 increases. While, if also the sampling circuit of the capacitor 29b of the 1-bit AD conversion circuit 24 is a double sampling type, the sampling interval (Ts) increases, so that the settling time may be accordingly set longer. Thus, it is possible to reduce the driving ability and the power consumption of the buffer circuit 38.

Further, buffer circuits can be respectively provided in the sampling circuits 8a and 8b, and the sampling circuit of the capacitor 29b, thereby reducing the power consumption of each buffer circuit.

That is, due to an effect of the noise shaping, an error or a noise included in the sampling circuit of the capacitor 29b serving as an input section of the ΔΣ AD converter has little influence on an output of the ΔΣ AD converter. Thus, it is not necessary to settle each sampling circuit of the capacitor 29b with high accuracy. As a result, it is possible to reduce the power consumption of the buffer circuit provided to drive sampling circuits of the capacitor 29b.

While, the buffer circuit provided to drive both the sampling circuits 8a and 8b do not have to drive the sampling circuits of the capacitor 29b at the same time, so that it is possible to set the settling time to Ts twice as long as (½)Ts of the conventional structure (FIG. 14), thereby reducing the power consumption.

Figure 7:
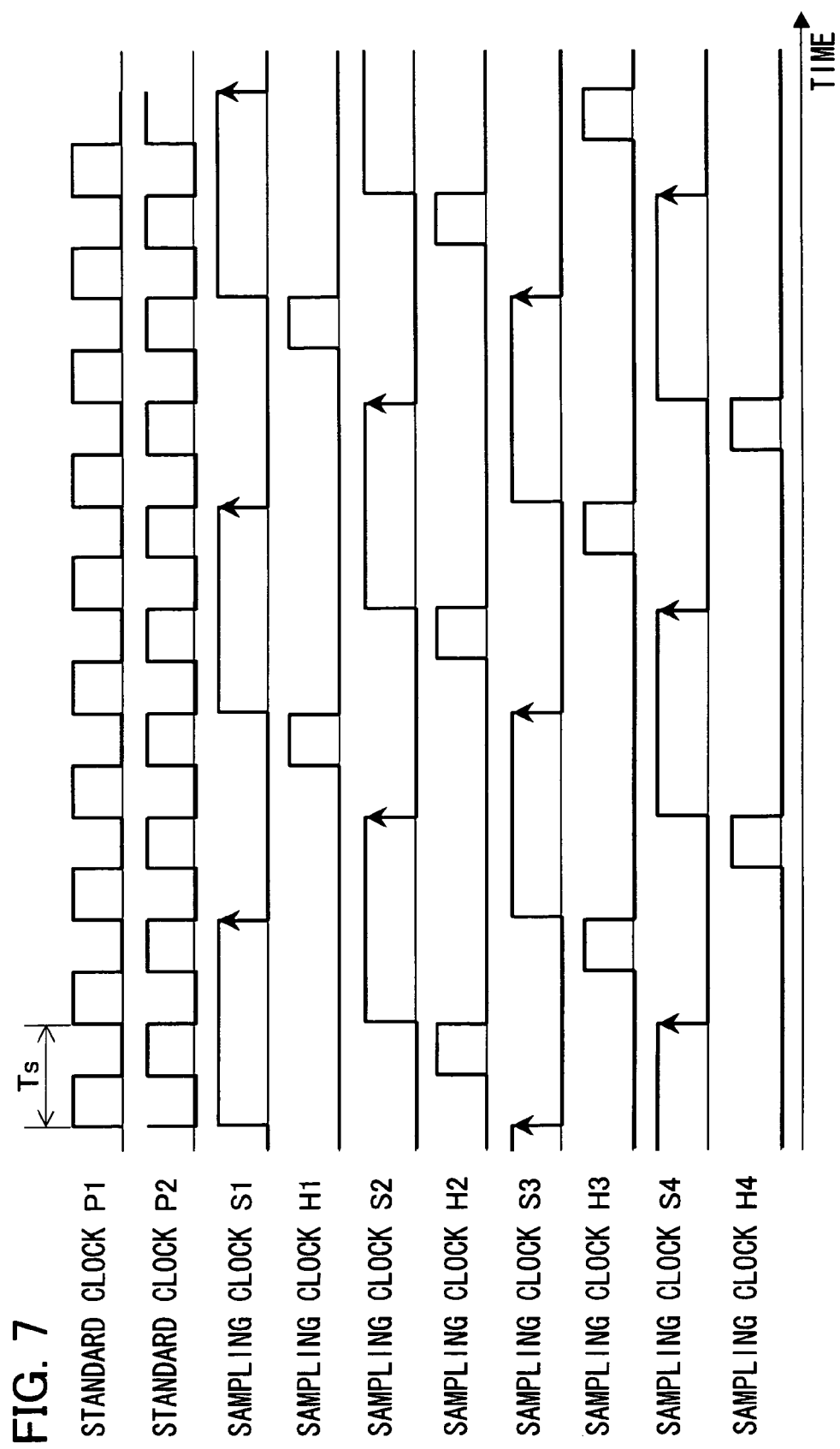
FIG. 7 is a timing chart illustrating a modification example of the sampling section provided in the AD converter of the present invention.

FIG. 7 is a timing chart illustrating a modification example of the sampling section provided in the ΔΣ AD converter 1. The foregoing embodiment described an example where two sampling circuits 8a and 8b for delaying the input signal are provided. However, the present invention is not limited to this. Also in case where n number of sampling circuits (N is an integer not less than 3) are provided, it is possible to realize the same function. FIG. 7 is a timing chart corresponding to FIG. 2 in case of N=4.

Sampling clocks S1, H1, S2, H2, S3, H3, S4, and H4 respectively correspond to control clocks for respectively operating four switched-capacitor sampling circuits disposed parallel to each other. According to this structure, it is possible to increase a period in which the input signal is sampled (Ts×2 in FIG. 7). Thus, it is possible to reduce the power consumption of the buffer circuit for driving the sampling circuit of the ΔΣ AD converter. Further, increase in the settling time reduces an error caused by the settling, so that it is possible to realize highly accurate AD conversion.

Figure 8:
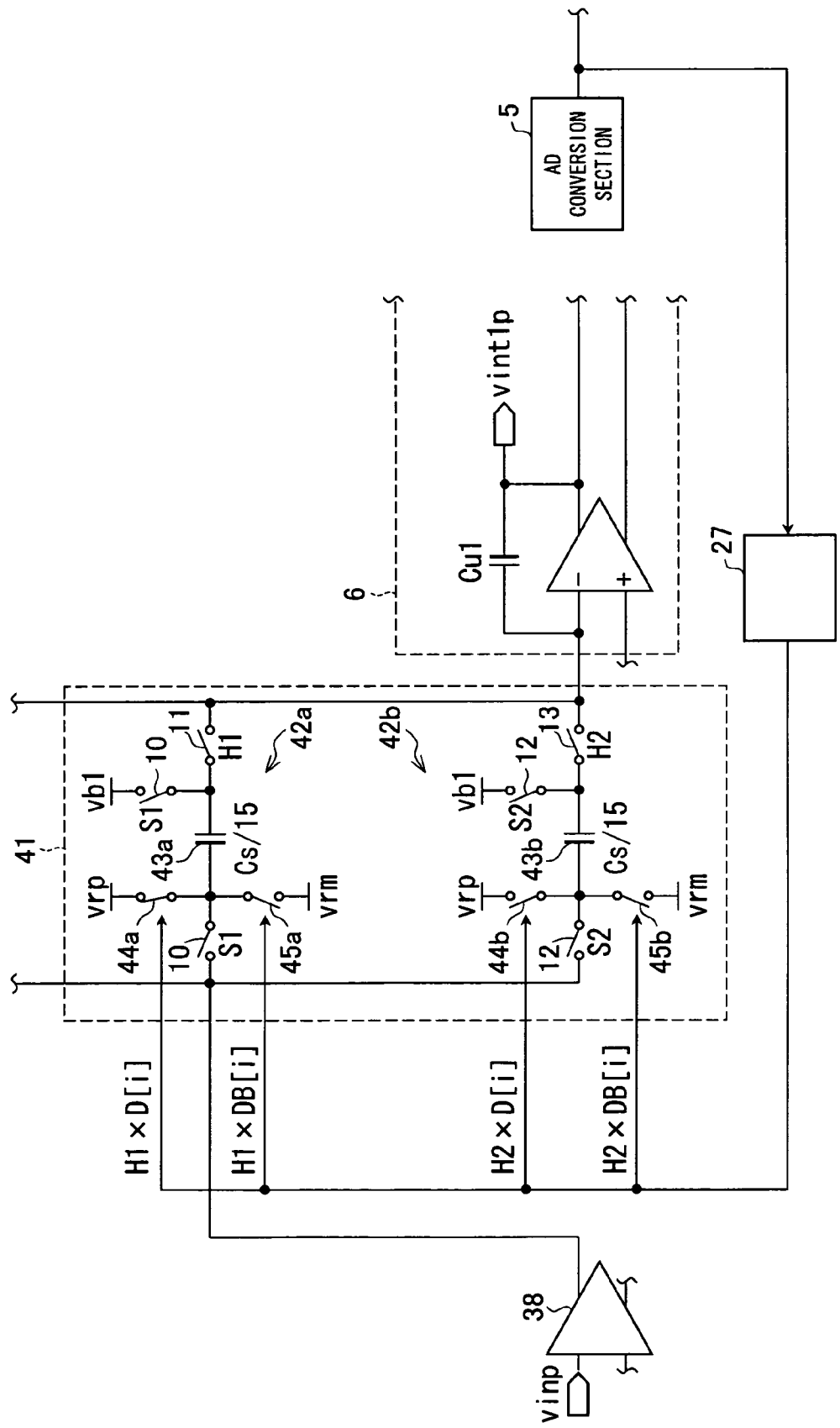
FIG. 8 is a circuit diagram illustrating another modification example of the sampling section provided in the AD converter of the present invention.

FIG. 8 is a circuit diagram illustrating another modification example of the sampling circuit provided in the ΔΣ AD converter. As described in the foregoing embodiment with reference to FIG. 2 and FIG. 5, the sampling section 2 for sampling the input signal and the DA conversion section 4 for converting an output of the AD conversion section 5 into a signal having an analog value so as to input the converted signal to the loop filter 6 are realized by the switched capacitor circuits different from each other. However, the structure can be arranged so that the capacitor and the switch are shared by the sampling section and the DA conversion section. An example thereof is illustrated in FIG. 8.

Instead of the sampling section 2 and the DA conversion section 4, fifteen DA conversion sampling sections 41 disposed parallel to one another are provided in the ΔΣ AD converter. Each of the fifteen DA conversion sampling sections 41 performs not only the double sampling of the input signal but also 1-bit DA conversion at the same time. Each of the DA conversion sampling sections 41 includes two DA conversion sampling circuits 42a and 42b disposed parallel to each other.

The DA conversion sampling circuit 42a includes a capacitor 43a having a capacitance Cs/15. Switches 10 which become ON while the sampling clock S1 is high and become OFF while the sampling clock S1 is low are provided on each of the upstream side and the downstream side of the capacitor 43a. The switch 10 on the upstream side becomes ON while the sampling clock S1 is high and leads the differential input signal vinp to the capacitor 43a so that the signal is stored as electric charge. The switch 10 on the downstream side becomes ON while the sampling clock S1 is high and connects the capacitor 43a to a terminal whose reference potential is vb1.

Switches 44a and 45a are provided on the upstream side of the capacitor 43a. The switch 44a is ON while AND of the sampling clock H1 and the digital data D[i] is "truth", and connects a terminal of the differential reference level vrp to the capacitor 43s so that electric charge is stored. The switch 45a becomes ON while AND of the sampling clock H1 and the digital data DB[i] is "truth", and connects a terminal of the differential reference level vrm to the capacitor 43a so that electric charge is stored. A switch 11 is connected to the downstream side of the capacitor 43a. The switch 11 becomes ON while the sampling clock H1 is high, and releases the electric charge stored in the capacitor 43a to the loop filter 6.

The DA conversion sampling circuit 42b includes a capacitor 43b having a capacitance Cs/15. Switches 12 which become ON while the sampling clock S2 is high and become OFF while the sampling clock S2 is low are provided on each of the upstream side and the downstream side of the capacitor 43b. The switch 12 on the upstream side becomes ON while the sampling clock S2 is high, and leads the differential input signal vinp to the capacitor 43b so that the signal is stored as electric charge. The switch 12 on the downstream side becomes ON while the sampling clock S2 is high, and connects the capacitor 43b to a terminal whose reference potential is vb1.

Switches 44b and 45b are provided on the upstream side of the capacitor 43b. The switch 44b becomes ON while AND of the sampling clock H2 and the digital data D[i] is "truth", and connects a terminal of the differential reference level vrm to the capacitor 43b so that electric charge is stored. A switch 13 is connected to the downstream side of the capacitor 43b. The switch 13 becomes ON while the sampling clock H2 is high, and releases the electric charge stored in the capacitor 43b to the loop filter 6.

While the sampling clock S1 or the sampling clock S2 is high, two capacitors 43a and 43b of each of fifteen switched capacitor circuits connected parallel to one another alternately sample the differential input signal vinp. While the sampling clock H1 or the sampling clock H2 is high, a terminal provided on each of the capacitors 43a and 43b so as to be positioned on the side of the differential input signal vinp is connected to a terminal of the differential reference level vrp or a terminal of the differential reference level vrm. Further, a difference between the sampled differential input signal vinp and the differential reference level vrp or the differential reference level vrm which has been subjected to the DA conversion is outputted to the loop filter 6.

In this way, the sampling circuits 8a and 8b illustrated in FIG. 2 and FIG. 5 are replaced by the fifteen switched capacitor circuits each of which includes the capacitors 43a and 43b each having the capacitance Cs/15, and the sampling clocks H1 and H2 are used instead of the standard clock P1 so as to supply the digital data D[i] and DB[i], so that the capacitors and the switches can be shared by the sampling section and the DA conversion section.

In an example illustrated in FIG. 5, two capacitors 9a and 9b each having a capacitance Cs alternately sample the input signal at each Ts cycle. Thus, in terms of a noise, the capacitors 9a and 9b are equal to a single capacitor which has a capacitance Cs and performs sampling at a Ts cycle. Further, in an example illustrated in FIG. 8, also the two capacitors 43a and 43b which are provided in each of the fifteen DA sampling sections 41 so that each of the capacitors 43a and 43b has the capacitance Cs/15 alternately sample the input signal at each Ts cycle, so that the capacitors 43a and 43b are equal to a single capacitor which has a capacitance Cs/15 and performs sampling at a Ts cycle.

Thus, the sampling capacitance exemplified in FIG. 5 is $2Cs(=Cs+(Cs/15)\times15)$, and the sampling capacitance exemplified in FIG. 8 is $Cs(=(Cs/15)\times15)$. Thus, by adopting the structure illustrated in FIG. 8, it is possible to reduce the sampling capacitance to ½ compared with the structure illustrated in FIG. 5. Thus, it is possible to reduce a noise (kTC noise) caused by the sampling to ½.

Embodiment 2

Figure 9:
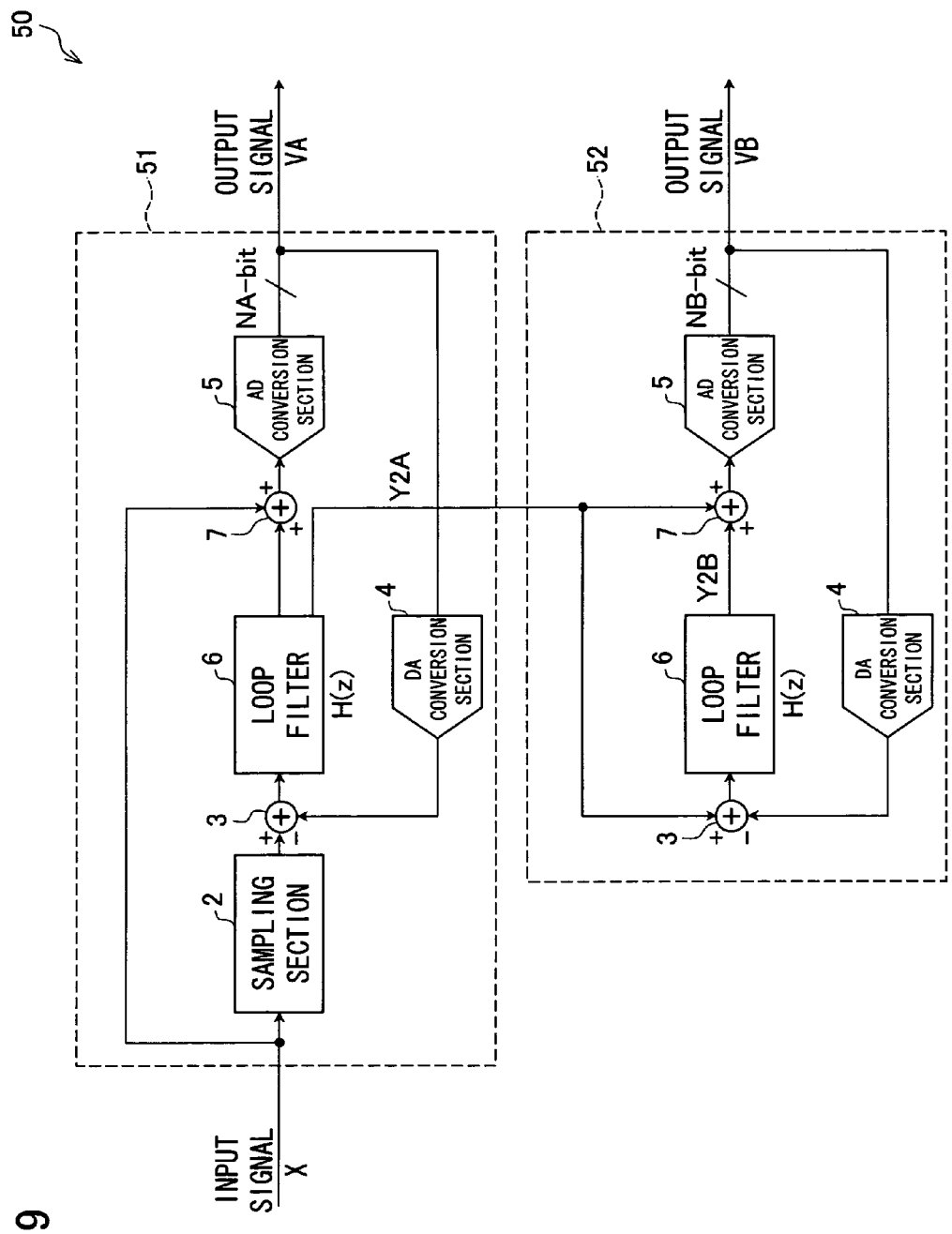
FIG. 9 is a block diagram schematically illustrating another embodiment of the AD converter of the present invention.
Figure 10:
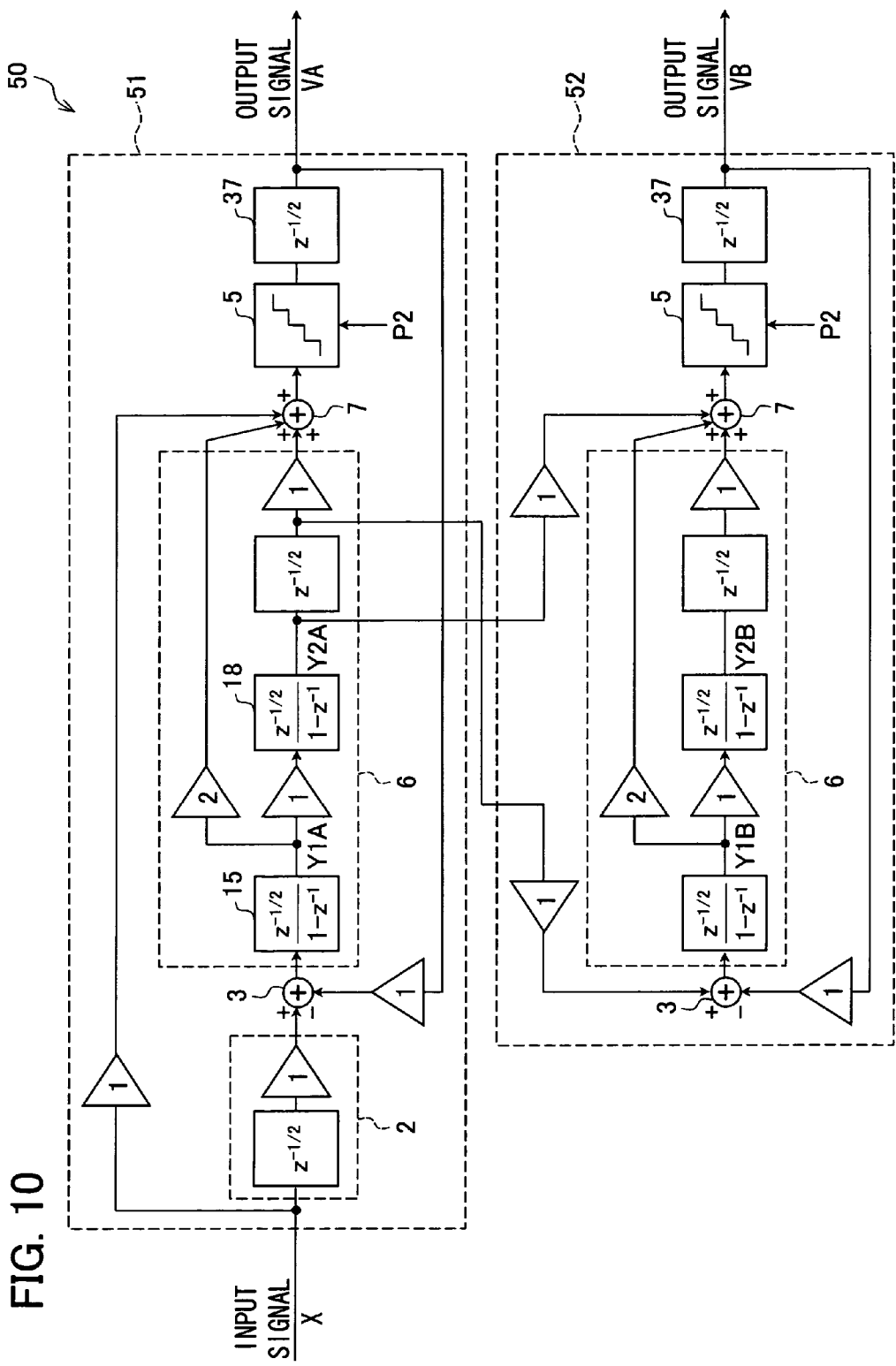
FIG. 10 is a detail block diagram using a linear model of the AD converter.

The following explains Embodiment 2 of the present invention with reference to FIG. 9 and FIG. 10. Note that, Embodiment 2 is arranged in the same manner as in Embodiment 1 except for the following description. For convenience in description, the same reference numerals are given to members having the same functions as those of the members illustrated in the drawings of Embodiment 1, and descriptions thereof are omitted. Embodiment 3 will be described in the same manner.

FIG. 9 is a block diagram schematically illustrating another embodiment of the AD converter. The AD converter is a MASH type (multi-stage noise shaping type) $\Delta\Sigma$ AD converter 50, and the present embodiment describes an example of a 2 stage type. The MASH-type $\Delta\Sigma$ AD converter 50 includes not only a stage 51 which is a structure of the $\Delta\Sigma$ AD converter 1 of Embodiment 1 but also a stage 52.

The stage 52 includes an ordinary $\Delta\Sigma$ AD converter in which an integration signal Y2A of the loop filter 6 of the stage 51 is used as an input signal. The loop filter 6 of the stage 51 supplies the integration signal Y2A to a subtracter 3 and an adder 7 of the stage 52. The adder 7 of the stage 52 adds an integration signal Y2B of the loop filter 6 of the stage 52 to the integration signal Y2A so as to output the resultant to an AD conversion section 5. The AD conversion section 5 outputs an output signal VB on the basis of the output of the adder 7 so as to provide the output signal VB to a DA conversion section 4. The DA conversion section 4 performs analog conversion with respect to the output signal VB of the AD conversion section 5 and provides the converted signal to the subtracter 3. The subtracter 3 subtracts an output of the DA conversion section 4 of the stage 52 from the integration signal Y2A of the stage 51 so as to provide the resultant to the loop filter 6. The loop filter 6 outputs the integration signal Y2B obtained by integrating the output of the subtracter to the adder 7.

By performing desired calculation with respect to an output signal VA of the stage 51 and an output signal VB of the stage 52 so as to cancel an error, it is possible to obtain a final output signal V. Further, in the stage 52, it is not necessary to provide a double sampling circuit (sampling section 2) required in the stage 51.

As indicated by differential integration signals vint2p and vint2m of FIG. 3, the integration signal Y2A outputted from the loop filter 6 of the stage 51 keeps the same value at both a period in which the standard clock P2 is high and a period in which the standard clock P2 is subsequently low. When an output supplied from the loop filter 6 of the stage 51 to the subtracter 3 of the stage 52 is delayed from an output supplied from the loop filter 6 of the stage 51 to the adder 7 of the stage 52 by ½ Ts, delay of ½ Ts is allowed in the AD conversion section 5 and the DA conversion section 4 of the stage 52 as in the stage 51.

FIG. 10 is a detail block diagram using a linear model of the MASH-type ΔΣ AD converter 50. The stage 51 is arranged in the same manner as in the structure illustrated in FIG. 4, so that description thereof is omitted. The stage 52 is described as follows. A signal obtained by delaying the integration signal Y2A of the integrator 18 of the stage 51 by ½ Ts is inputted to the subtracter 3 positioned before the loop filter 6 of the stage 52. While, the integration signal Y2A is inputted, without any modification, to the adder 7 positioned before the AD conversion section 5 of the stage 52. According to the foregoing structure, the AD conversion section 5 and the DA conversion section 4 are allowed to delay up to ½ Ts also in the stage 52. Thus, also in the stage 52 of the MASH type ΔΣ AD converter 50, it is possible to reduce area sizes and power consumption of the AD conversion section 5 and the DA conversion section 4.

Embodiment 3

Figure 11:
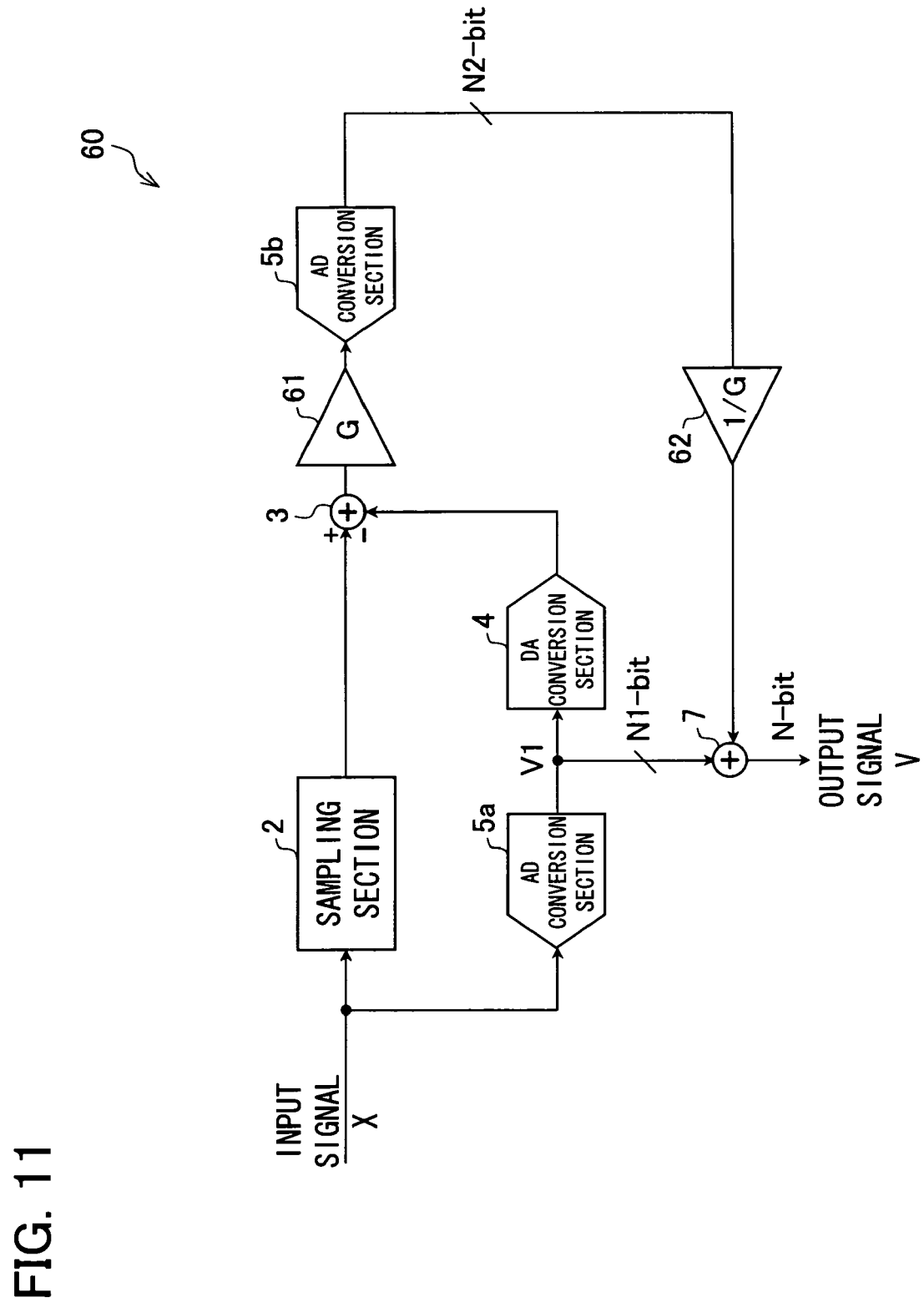
FIG. 11 is a block diagram schematically illustrating still another embodiment of the AD converter of the present invention.

FIG. 11 is a block diagram schematically illustrating a pipelined AD converter 60 which is still another embodiment of the AD converter of the present invention. The pipelined AD converter 60 includes: a sampling section 2 for performing double sampling with respect to an input signal X; an AD conversion section 5a for sampling the input signal X so as to perform conversion into a digital value; a DA conversion section 4 for converting an N1-bit output of the AD conversion section 5a into a signal having an analog value; a subtracter 3 for subtracting an output of the DA conversion section 4 from an output of the sampling section 2; an amplifier 61 for amplifying an output of the subtracter 3 so as to transmit the amplified output to an AD conversion section 5b at a subsequent stage; an AD conversion section 5b for converting an output signal of the amplifier 61 into an N2-bit digital value; a digital amplifier 62 for multiplying a digital output signal of the AD conversion section 5b by a desired gain; and an adder 7 for adding an output of the digital amplifier 62 to the N1-bit output of the AD. conversion section 5a.

Figure 12:
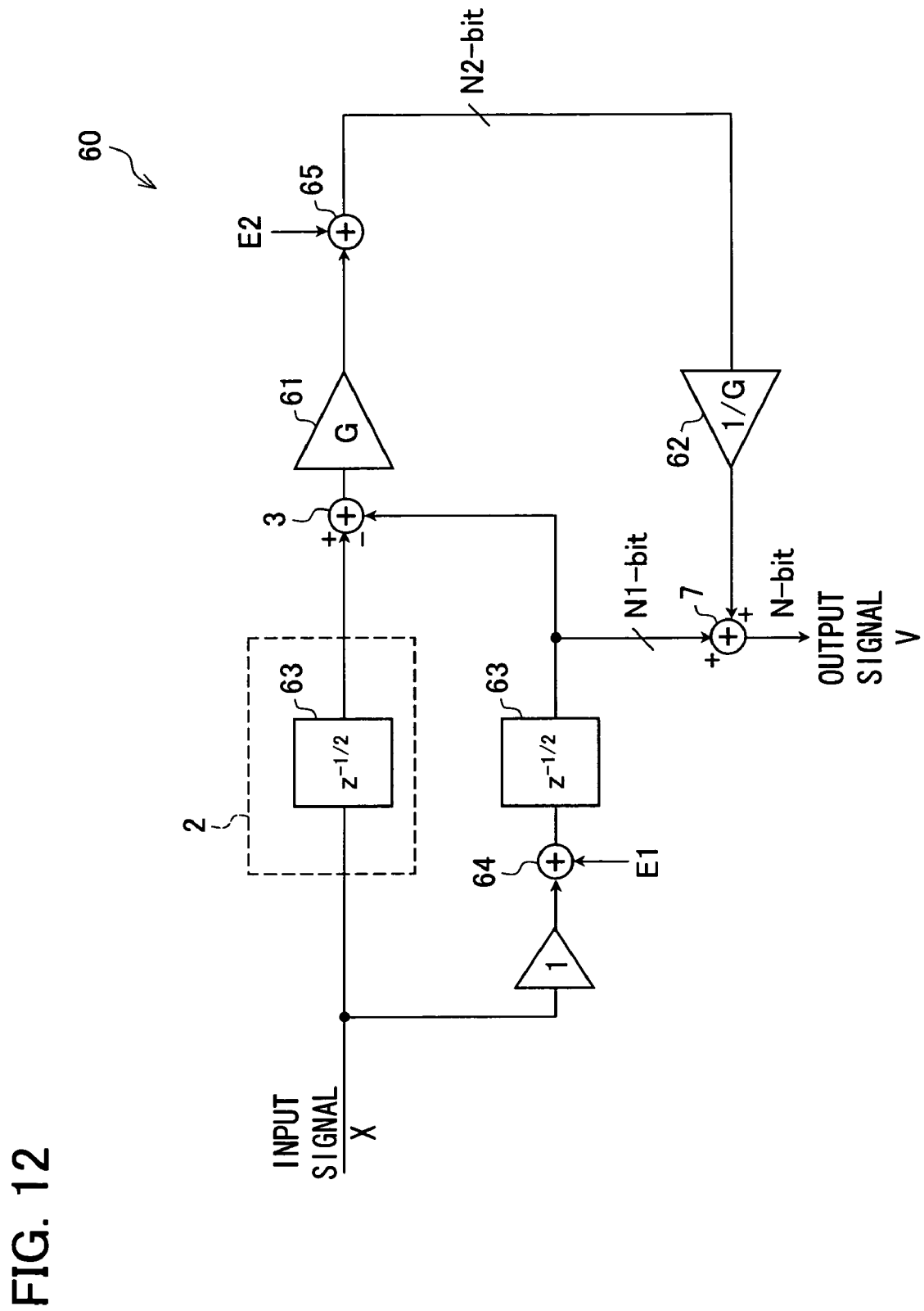
FIG. 12 is a detail block diagram using a linear model of the AD converter.
Figure 13:
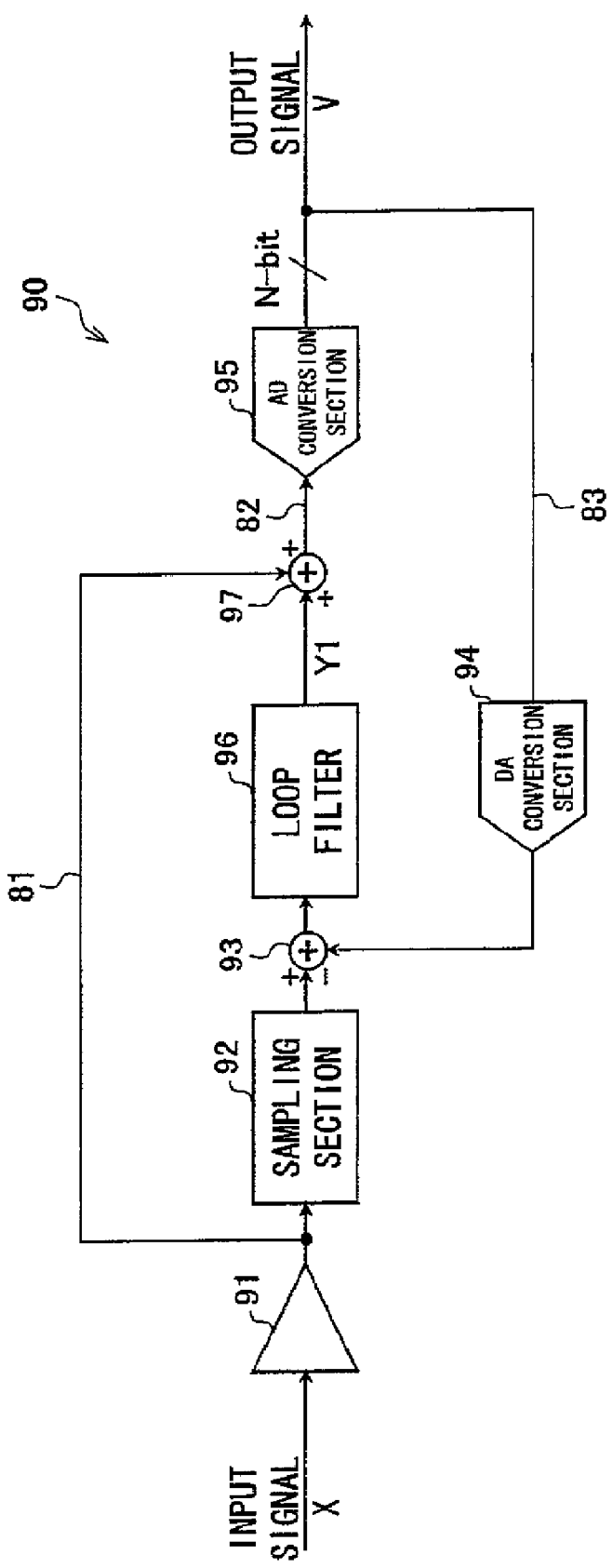
FIG. 13 is a block diagram schematically illustrating a conventional $\Delta\Sigma$ AD converter.

FIG. 12 is a detail block diagram using a linear model of the pipelined AD converter 60. As described in Embodiment 1, the sampling section 2 can delay the input signal X by (½)Ts (clock), so that the sampling section 2 can be replaced by a delay stage 63.

As in Embodiment 1, also the pipelined AD converter 60 of the present embodiment includes, as a signal path of the input signal X to the subtracter 3, a signal path which passes through the sampling section 2 and reaches the subtracter 3 and a signal path which passes through the Ad conversion section 5a and the DA conversion section 4 and reaches the subtracter 3, and signals having passed through both the signal paths are subjected to subtraction of the subtracter 3. Thus, if both the signal paths are different from each other in the delay time, a waveform indicative of an output signal may have distortion as in Embodiment 1.

However, as in Embodiment 1, also the pipelined AD converter 60 of the present embodiment includes the delay stage 63 provided on the signal path which passes through the sampling section 2 and reaches the subtracter 3 as a result of double sampling performed by the sampling section 2 with respect to the input signal X. Thus, it is possible to additionally provide the delay stage 63 on the signal path which passes through the AD conversion section 5a and the DA conversion section 4 and reaches the subtracter 3. Note that, if both the delay stages 63 are set to be equal to each other in terms of a delay quantity, it is possible to most effectively suppress waveform distortion of the output signal which is caused by the input signal.

Thus, it is possible to decrease the operation speed of the AD conversion section 5a and the DA conversion section 4. As a result, it is possible to reduce the circuit sizes and the power consumption of the AD conversion section 5a and the DA conversion section 4.

A transfer function from the input signal X to the output signal V in FIG. 12 is represented by the following Expression 7.

$$V(z) = (X(z) + E1(z)) \cdot z^{-1/2} +$$
$$[(X(z) \cdot z^{-1/2} - (X(z) + E1(z)) \cdot z^{-1/2}) \cdot G + E2(z)] \cdot \frac{1}{G}$$
$$= X(z) \cdot z^{-1/2} + \frac{E2(z)}{G}$$

Expression 7

As represented by the Expression 7, the output signal V is represented by a sum of the input signal X and a signal obtained by attenuating a quantization noise E2 leaked from the AD conversion section 5a with a gain G. A quantization noise E1 of the AD conversion section 5a is cancelled, so that the quantization noise E1 does not appear in the output signal V. In this way, according to the pipelined AD converter 60, the input signal X is slightly delayed in being outputted, and it is possible to realize the same function as that of the conventional pipelined AD converter.

Note that, in Embodiments 1 to 3, the sampling section for sampling the input signal X includes a plurality of sampling circuits disposed parallel to each other so that double sampling is performed, but the present invention is not limited to this. The sampling section may be arranged so that double sampling is performed by the loop filter, the AD conversion section, and the DA conversion section.

Further, in the sampling circuit for performing the double sampling with respect to the input signal, there occur (i) capacitance mismatch (gain mismatch) of each switched capacitor circuit, (ii) charge injection mismatch (offset mismatch caused by the switch), and (iii) mismatch caused by Phase Skew of a control clock for sampling, so that a tone caused by these mismatches occurs. As a result, its performance generally deteriorates. However, in case of using the sampling circuit in a radio communication receiver and the like, an Anti-Alias filter or the like disposed at the previous stage of the sampling circuit reduces an out-of-band signal to some extent, so that a tone included in a band as a result of the foregoing mismatches has low signal power. Thus, high accuracy is not required in covering the mismatches. Particularly, in case where an oversampling ratio is high, accuracy is less required in covering the mismatches.

The present invention is not limited to the description of the embodiments above, but may be altered by a skilled person within the scope of the claims. An embodiment based on a proper combination of technical means disclosed in different embodiments is encompassed in the technical scope of the present invention.

The present invention is applicable to a delta sigma AD converter or a pipelined AD converter which samples an input signal so as to perform AD conversion of the input signal.

It is preferable to arrange the AD converter of the present embodiment so that the plurality of sampling circuits are two switched capacitor type sampling circuits, and each of the switched capacitor type sampling circuits delays the input signal by ½ of the cycle Ts. A simple arrangement allows the sampling section to delay.

It is preferable to arrange the AD converter of the present embodiment so that a signal delay quantity in a signal path passing through the AD conversion section and the DA conversion section is equal to a delay quantity between an input and an output of the sampling section. The AD conversion section and the DA conversion section are allowed to delay until delay quantities thereof are equal to a delay quantity of the sampling section, so that it is possible to further reduce the operation speed, and it is possible to further reduce the circuit sizes and the power consumption.

It is preferable to arrange the AD converter of the present embodiment so that a single switched capacitor circuit serves as both the sampling section and the DA conversion section, and each of the sampling circuits includes a switch and a capacitor, and the plurality of sampling circuits delay the input signal so as to output the delayed input signal and perform DA conversion of the output of the AD conversion section. It is possible to reduce the sampling capacitance, so that it is possible to reduce a noise (kTC noise) caused by the sampling.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An AD converter, comprising:
   a sampling section for sampling an input signal at each cycle Ts;
   an AD conversion section for sampling the input signal at the same time as the sampling section and performing AD conversion of the sampled input signal;
   a DA conversion section for performing DA conversion of an output of the AD conversion section; and
   a loop filter for integrating a difference obtained by subtracting an output of the DA conversion section from an output of the sampling section so as to output the integrated difference to the AD conversion section, wherein
   the sampling section includes a plurality of sampling circuits disposed parallel to each other,
   the plurality of sampling circuits respectively operate at timings different from each other, and
   each of the sampling circuits keeps the sampled input signal from being transferred to the loop filter for ½ or more of the cycle Ts just after completion of the sampling of the input signal, during which the AD conversion section samples the input signal so as to cancel out the input signal component in the input signal to the loop filter.

2. An AD converter, comprising:
   a sampling section for sampling an input signal at each cycle Ts;
   a first AD conversion section for sampling the input signal at the same time as the sampling section and performing AD conversion of the sampled input signal;
   a first DA conversion section for performing DA conversion of an output of the first AD conversion section;
   a first loop filter for integrating a difference obtained by subtracting an output of the first DA conversion section from an output of the sampling section so as to output the integrated difference to the first AD conversion section;
   a second AD conversion section for performing AD conversion of an output of the first loop filter;
   a second DA conversion section for performing DA conversion of an output of the second AD conversion section; and
   a second loop filter for integrating a difference obtained by subtracting an output of the second DA conversion section from an output of the first loop filter so as to output the integrated difference to the second AD conversion section, wherein
   the sampling section includes a plurality of sampling circuits disposed parallel to each other,
   the plurality of sampling circuits respectively operate at timings different from each other, and
   each of the sampling circuits keeps the sampled input signal from being transferred to the loop filter for ½ or more of the cycle Ts just after completion of the sampling of the input signal during, which the AD conversion section samples the input signal so as to cancel out the input signal component in the input signal to the loop filter.

3. An AD converter, comprising:
   a sampling section for sampling an input signal at each cycle Ts;
   a first AD conversion section for performing AD conversion of the input signal;
   a DA conversion section for performing DA conversion of an output of the first AD conversion section;
   an amplifier for amplifying a difference obtained by subtracting an output of the DA conversion section from an output of the sampling section;
   a second AD conversion section for performing AD conversion of an output of the amplifier;
   a digital amplifier for amplifying an output of the second AD conversion section; and
   an adder for adding an output of the digital amplifier to the output of the first AD conversion section so as to output a result of addition, wherein
   the sampling section includes a plurality of sampling circuits disposed parallel to each other,
   the plurality of sampling circuits respectively operate at timings different from each other, and
   each of the sampling circuits keeps the sampled input signal from being transferred to the loop filter for ½ or more of the cycle Ts just after completion of the input signal sampling, during which the AD conversion section processes the sampled input signal so as to output the delayed input signal.

4. The AD converter as set forth in claim 1, wherein
   the plurality of sampling circuits are two switched capacitor type sampling circuits, and
   each of the switched capacitor type sampling circuits keeps the sampled input signal from being transferred to the loop filter for ½ of the cycle Ts just after completion of the input signal sampling.

5. The AD converter as set forth in claim 1, wherein a signal delay quantity in a signal path passing through the AD conversion section and the DA conversion section is equal to a delay quantity between an input and an output of the sampling section.

6. The AD converter as set forth in claim 1, wherein
a single switched capacitor circuit serves as both the sampling section and the DA conversion section,
each of the sampling circuits includes a switch and a capacitor, and
the plurality of sampling circuits delay the input signal so as to output the delayed input signal and perform DA conversion of the output of the AD conversion section.

7. The AD converter as set forth in claim 2, wherein
the plurality of sampling circuits are two switched capacitor type sampling circuits, and
each of the switched capacitor type sampling circuits keeps the sampled input signal from being transferred to the loop filter for ½ of the cycle Ts just after completion of the input signal sampling.

8. The AD converter as set forth in claim 3, wherein
the plurality of sampling circuits are two switched capacitor type sampling circuits, and
each of the switched capacitor type sampling circuits delays keeps the sampled input signal from being transferred to the loop filter for ½ of the cycle Ts just after completion of the input signal sampling.

9. The AD converter as set forth in claim 2, wherein a signal delay quantity in a signal path passing through the AD conversion section and the DA conversion section is equal to a delay quantity between an input and an output of the sampling section.

10. The AD converter as set forth in claim 3, wherein a signal delay quantity in a signal path passing through the AD conversion section and the DA conversion section is equal to a delay quantity between an input and an output of the sampling section.

11. The AD converter as set forth in claim 2, wherein
a single switched capacitor circuit serves as both the sampling section and the DA conversion section,
each of the sampling circuits includes a switch and a capacitor, and
the plurality of sampling circuits delay the input signal so as to output the delayed input signal and perform DA conversion of the output of the AD conversion section.

12. The AD converter as set forth in claim 3, wherein
a single switched capacitor circuit serves as both the sampling section and the DA conversion section,
each of the sampling circuits includes a switch and a capacitor, and
the plurality of sampling circuits delay the input signal so as to output the delayed input signal and perform DA conversion of the output of the AD conversion section.

* * * * *